(12) United States Patent
Ji et al.

(10) Patent No.: US 10,963,339 B2
(45) Date of Patent: Mar. 30, 2021

(54) DATA STORAGE DEVICE AND OPERATING METHOD THEREOF

(71) Applicant: SK hynix Inc., Icheon-si (KR)

(72) Inventors: Seung Gu Ji, Seoul (KR); Hyun Jun Lee, Yongin-si (KR); Byeong Gyu Park, Seongnam-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/591,272

(22) Filed: Oct. 2, 2019

(65) Prior Publication Data

US 2020/0218606 A1  Jul. 9, 2020

(30) Foreign Application Priority Data

Jan. 7, 2019 (KR) .................. 10-2019-0001712

(51) Int. Cl.

| G06F 11/00 | (2006.01) |
|---|---|
| H03M 13/00 | (2006.01) |
| G06F 11/10 | (2006.01) |
| G11C 16/10 | (2006.01) |
| G11C 11/56 | (2006.01) |
| G11C 16/26 | (2006.01) |
| H03K 19/21 | (2006.01) |

(52) U.S. Cl.
CPC ...... *G06F 11/1068* (2013.01); *G06F 11/1004* (2013.01); *G11C 11/5621* (2013.01); *G11C 16/10* (2013.01); *G11C 16/26* (2013.01); *H03K 19/21* (2013.01)

(58) Field of Classification Search
CPC .. G06F 11/1068; G06F 11/1004; G11C 16/10; G11C 16/26; G11C 11/5621; H03K 19/21
See application file for complete search history.

(56) References Cited

U.S. PATENT DOCUMENTS

2011/0252288 A1* 10/2011 Sharon ............... G06F 11/1048
714/758
2015/0019933 A1* 1/2015 Yamazaki ............ G06F 11/108
714/758

FOREIGN PATENT DOCUMENTS

KR  10-2012-0093385  8/2012

* cited by examiner

*Primary Examiner* — Samir W Rizk
(74) *Attorney, Agent, or Firm* — Perkins Coie LLP

(57) ABSTRACT

Methods, systems and devices for efficiently performing a read fail recovery operation are described. An exemplary data storage device includes a nonvolatile memory device including a page group in which program-completed pages and program-in-progress pages are mixed, a buffer memory configured to buffer data and an XOR parity to be stored in pages of the page group. The data storage device also includes a recovery circuit configured to recover an error of read-failed data, and a processor configured to control the recovery circuit to read data and an XOR parity corresponding to the program-in-progress pages from the buffer memory. The processor is also configured to recover the error of the read-failed data using data corresponding to remaining program-completed pages other than a page in which the read-failed data is stored among the program-completed pages, and the data and the XOR parity read from the buffer memory.

19 Claims, 18 Drawing Sheets

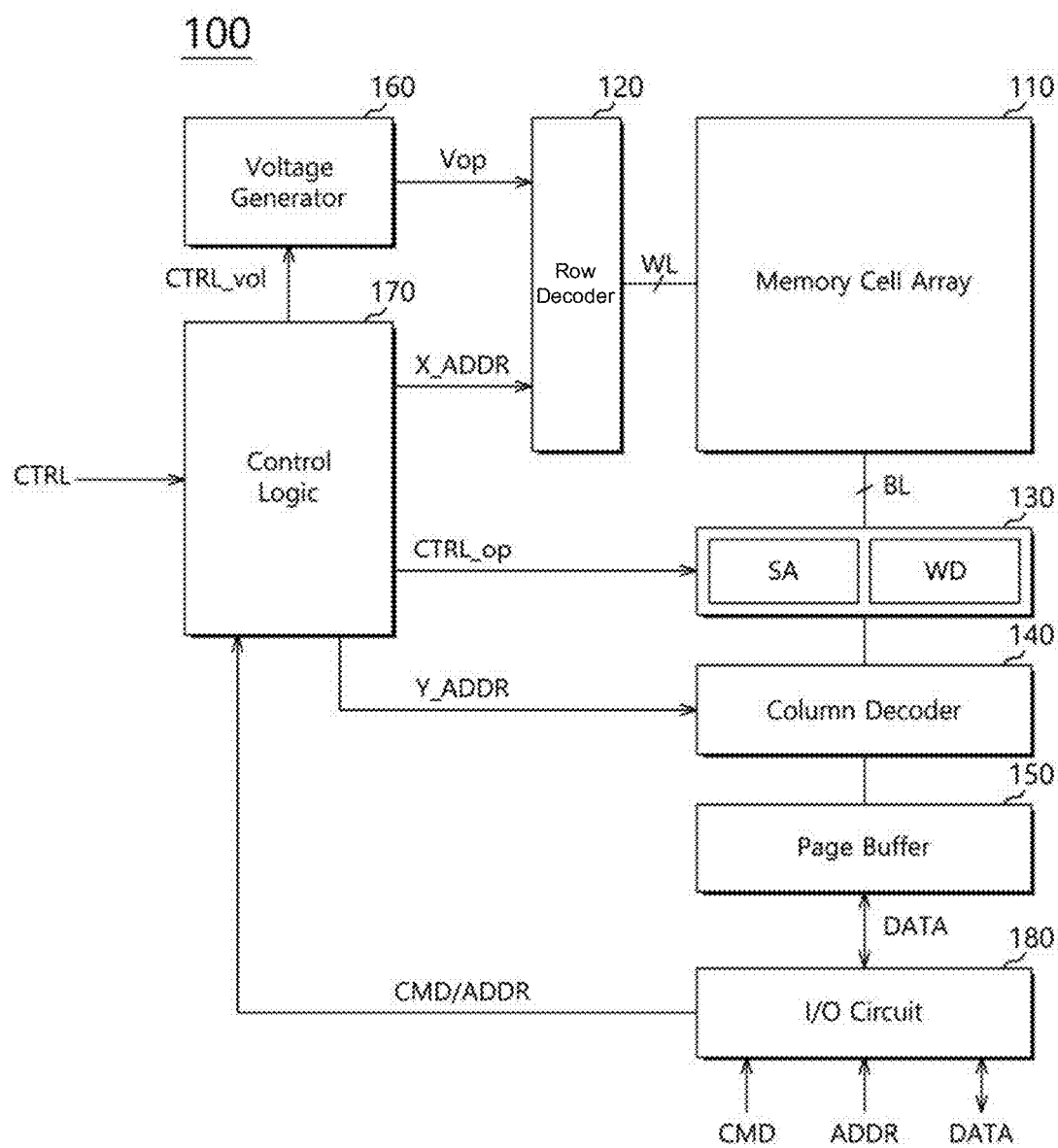

<THRESHOLD VOLTAGE DISTRIBUTION OF PAGE THAT FIRST QLC PROGRAM IS COMPLETED>

<THRESHOLD VOLTAGE DISTRIBUTION OF PAGE THAT SECOND QLC PROGRAM IS COMPLETED>

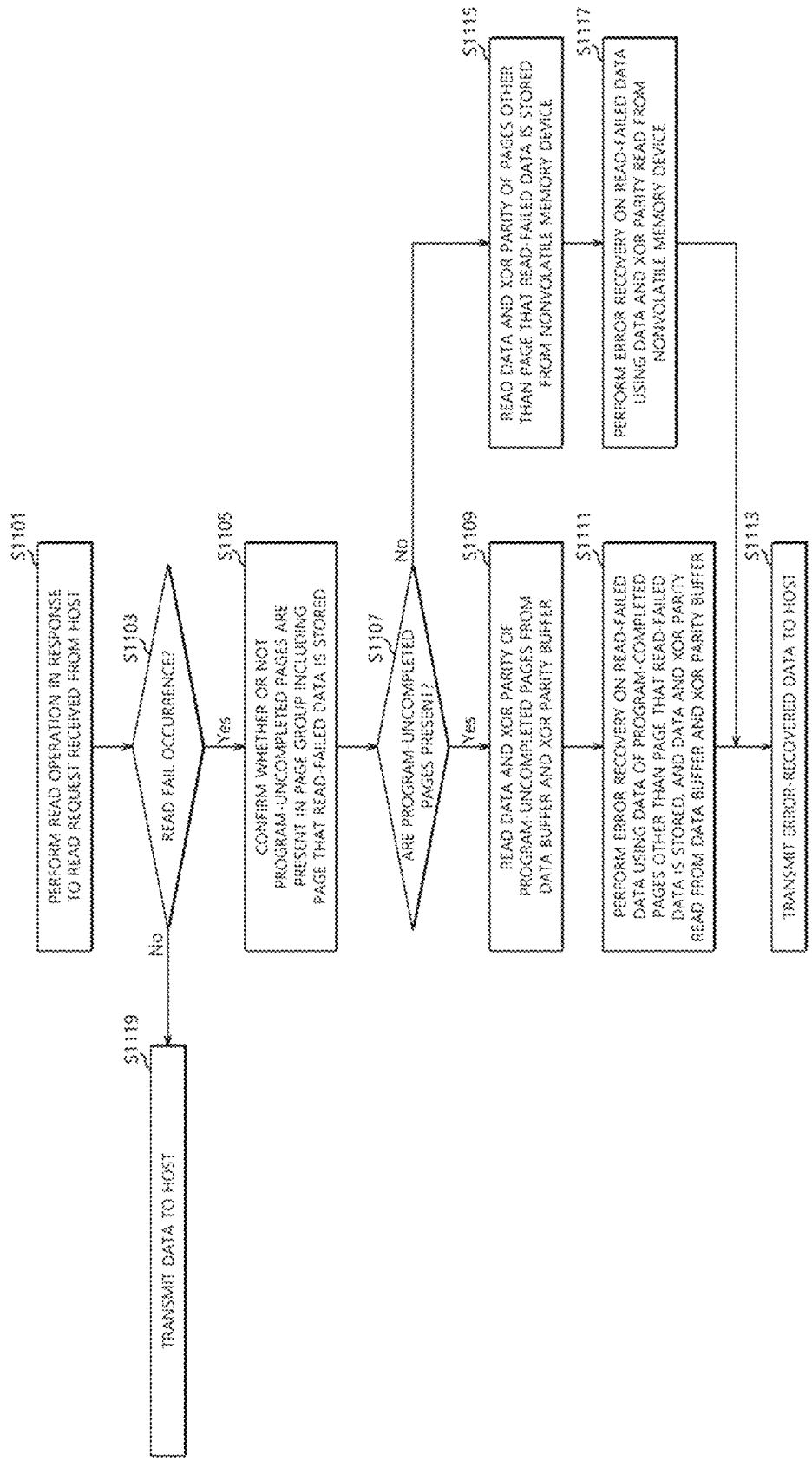

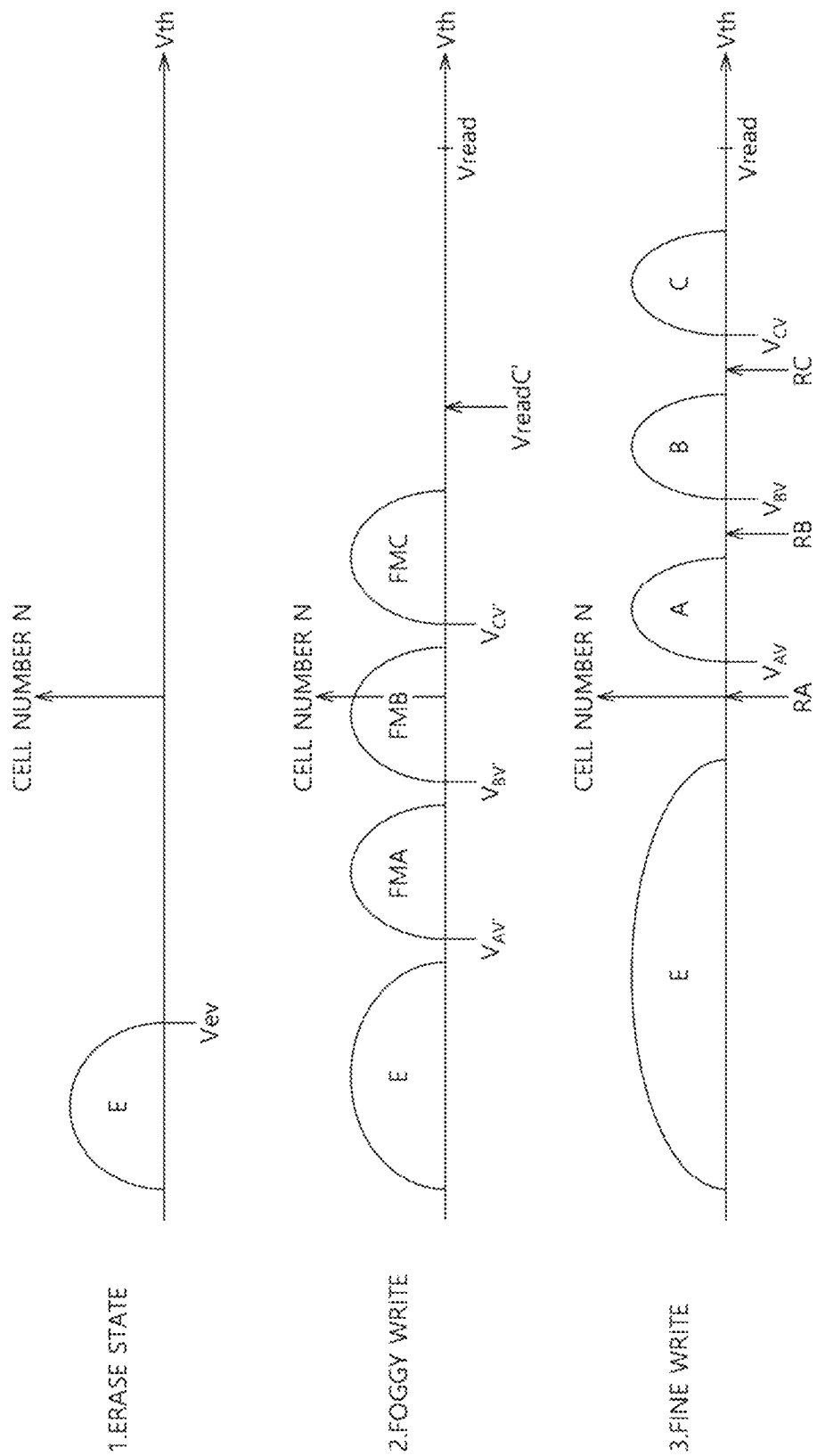

DATA STORAGE DEVICE AND OPERATING METHOD THEREOF

CROSS-REFERENCES TO RELATED APPLICATION

This patent document claims priority to Korean patent application number 10-2019-0001712, filed on Jan. 7, 2019, which is incorporated herein by reference in its entirety for all purposes.

TECHNICAL FIELD

The disclosed technology generally relates to electronic devices, and more particularly, to data storage devices.

BACKGROUND

In recent years, the paradigm for computer environments has changed from desktop computing to ubiquitous computing, which enables the use of computer systems anytime and everywhere. As a result, the use of portable electronic devices such as mobile phones, digital cameras, and laptop computers has been increasing rapidly. Typically, portable electronic devices use data storage devices that employ memory devices, which may be used to store data used in the portable electronic devices.

Data storage devices using memory devices have no mechanically driven units and exhibit good stability and endurance, fast information access rate, and low power consumption. Such data storage devices may include universal serial bus (USB) memory devices, memory cards having various interfaces, universal flash storage (UFS) devices, solid state drives (SSDs), and the like.

SUMMARY

Embodiments of the disclosed technology, among other features and benefits, provide data storage devices capable of effectively performing a read fail recovery operation.

In an embodiment of the present disclosure, a data storage device may include: a nonvolatile memory device including a plurality of page groups; a data buffer configured to store data to be stored in data pages of each of the plurality of page groups; an exclusive OR (XOR) parity buffer configured to store an XOR parity to be stored in an XOR parity page of each of the plurality of page groups; and a processor configured to, when program-in-progress pages are present in a page group including a read fail page in which read-failed data is stored in read fail occurrence during performing of a read operation according to a read request from a host, control data and an XOR parity corresponding to the program-in-progress pages to be read from the data buffer and the XOR parity buffer and control an error of the read-failed data to be recovered using data corresponding to program-completed pages other than the read fail page, and the data and the XOR parity read from the data buffer and the XOR parity buffer.

In an embodiment of the present disclosure, a data storage device may include: a nonvolatile memory device including a page group in which program-completed pages and program-in-progress pages are mixed; a buffer memory configured to buffer data and an exclusive OR (XOR) parity to be stored in pages of the page group; a recovery circuit configured to recover an error of read-failed data; and a processor configured to control the recovery circuit to read data and an XOR parity corresponding to the program-in-progress pages from the buffer memory and to recover the error of the read-failed data using data corresponding to remaining program-completed pages other than a page in which the read-failed data is stored among the program-completed pages, and the data and the XOR parity read from the buffer memory.

In an embodiment of the present disclosure, an operating method of a data storage device includes performing a read operation on a nonvolatile memory device in response to a read request from a host; confirming whether or not one or more program-in-progress pages are present in a page group including a page in which read-failed data is stored in read fail occurrence; reading, when the program-in-progress pages are present in the page group, data and an exclusive OR (XOR) parity corresponding to the program-in-progress pages from a buffer memory; and recovering an error of the read-failed data using data corresponding to program-completed pages other than the page in which the read-failed data is stored, and the data and the XOR parity read from the buffer memory.

In an embodiment of the present disclosure, a data storage device may include: a nonvolatile memory device including a plurality of page groups; a data buffer configured to store data to be stored in data pages of each of the plurality of page groups; an exclusive OR (XOR) parity buffer configured to store an XOR parity to be stored in an XOR parity page of each of the plurality of page groups; and a processor configured to, when program-uncompleted pages are present in a page group including a read fail page in which read-failed data is stored in read fail occurrence during performing of a read operation according to a read request from a host, control data and an XOR parity corresponding to the program-uncompleted pages to be read from the data buffer and the XOR parity buffer and control an error of the read-failed data to be recovered using data corresponding to program-completed pages other than the read fail page, and the data and the XOR parity read from the data buffer and the XOR parity buffer.

In an embodiment of the present disclosure, a data storage device may include: a nonvolatile memory device including a page group in which program-completed pages and program-uncompleted pages are mixed; a buffer memory configured to buffer data and an exclusive OR (XOR) parity to be stored in pages of the page group; a recovery circuit configured to recover an error of read-failed data; and a processor configured to control the recovery circuit to read data and an XOR parity corresponding to the program-uncompleted pages from the buffer memory and to recover the error of the read-failed data using data corresponding to remaining program-completed pages other than a page in which the read-failed data is stored among the program-completed pages, and the data and the XOR parity read from the buffer memory.

In an embodiment of the present disclosure, an operating method of a data storage device includes performing a read operation on a nonvolatile memory device in response to a read request from a host; confirming whether or not one or more program-uncompleted pages are present in a page group including a page in which read-failed data is stored in read fail occurrence; reading, when the program-uncompleted pages are present in the page group, data and an exclusive OR (XOR) parity corresponding to the program-uncompleted pages from a buffer memory; and recovering an error of the read-failed data using data corresponding to program-completed pages other than the page in which the read-failed data is stored, and the data and the XOR parity read from the buffer memory.

In some embodiments described in the present document, in a read fail occurrence for a page group in which program-completed pages and program-in-progress pages are mixed, the read fail may be recovered by reading the data and XOR parity of the program-in-progress pages from a buffer memory. Thus, the read fail recovery operation may be further performed more efficiently and quickly.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawings, dimensions may be exaggerated for clarity of illustration.

FIG. 2 is a diagram illustrating an exemplary configuration of a nonvolatile memory device, based on an embodiment of the presently disclosed technology.

FIG. 11 is a flowchart illustrating an example of an operating method of a data storage device, based on an embodiment of the presently disclosed technology.

FIG. 17 is a diagram illustrating an example of a two-stage foggy and fine write operation.

DETAILED DESCRIPTION

Semiconductor memory devices may be volatile or nonvolatile. The volatile semiconductor memory devices may perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

Some embodiments of the disclosed technology provide methods, systems and devices for efficiently performing a read-fail recovery operation in a nonvolatile memory device by reading data and/or XOR parity of program-in-progress pages from a buffer memory.

In an example, the read-fail recovery operation is part of a chipkill operation being performed to mitigate the effect of a read fail in NAND using a foggy-fine scheme.

Figure 1:
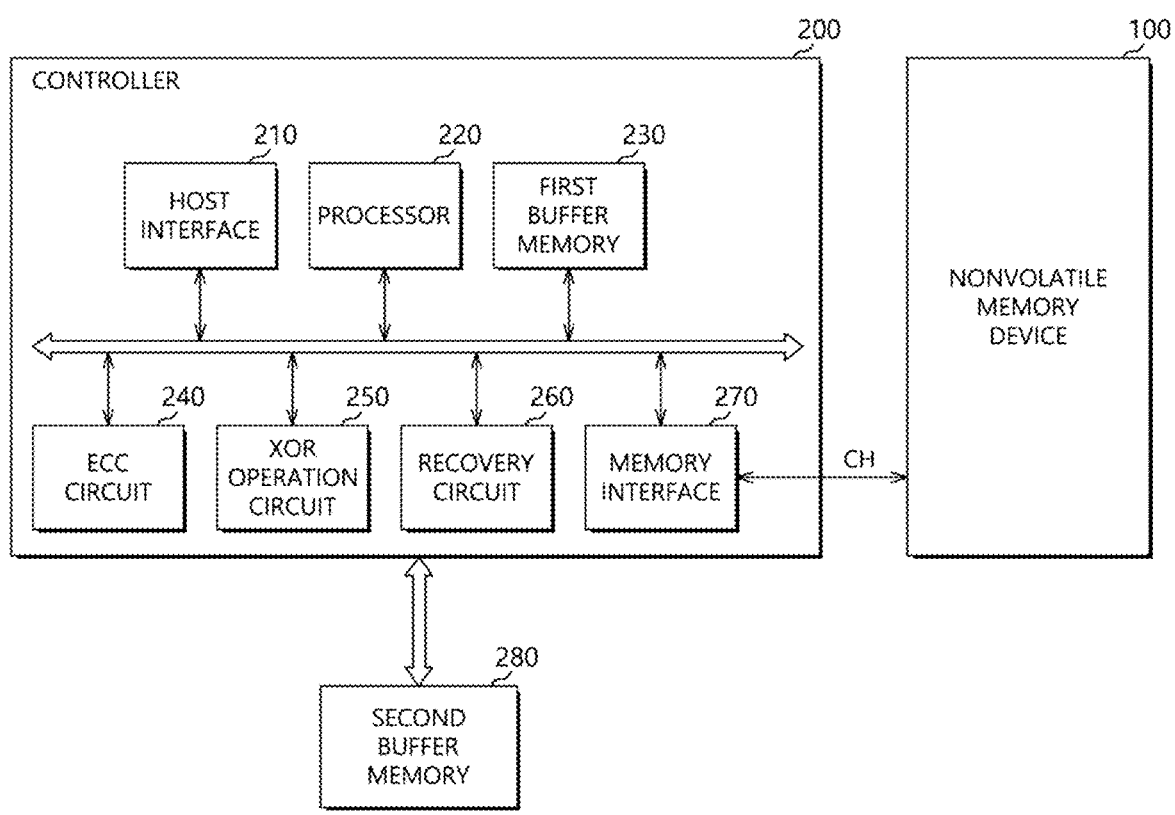
FIG. 1 is a diagram illustrating an exemplary configuration of a data storage device, based on an embodiment of the presently disclosed technology.

FIG. 1 is a diagram illustrating an example configuration of a data storage device 10, based on an embodiment of the disclosed technology.

Referring to FIG. 1, the data storage device 10 may store data to be accessed by a host (not illustrated in FIG. 1) such as a mobile phone, an MP3 player, a laptop computer, a desktop computer, a game player, a television (TV), or an in-vehicle infotainment system, and the like. In some embodiments, the data storage device 10 may refer to a memory system.

In some embodiments, the data storage device 10 may be manufactured as any one among various types of storage devices according to an interface protocol coupled to a host. For example, the data storage device 10 may be configured as any one of various types of storage devices, including, but not limited to, a solid state drive (SSD), a multimedia card in the form of an MMC, an eMMC, an RS-MMC, and a micro-MMC, a secure digital card in the form of an SD, a mini-SD, and a micro-SD, a universal serial bus (USB)

storage device, a universal flash storage (UFS) device, a personal computer memory card international association (PCMCIA) card type storage device, a peripheral component interconnect (PCI) card type storage device, a PCI-express (PCI-e) card type storage device, a compact flash (CF) card, a smart media card, a memory stick, and the like.

In some embodiments, the data storage device 10 may be manufactured as any one of various types of packages. For example, the data storage device 10 may be manufactured as a package on package (POP), a system in package (SIP), a system on chip (SOC), a multi-chip package (MCP), a chip on board (COB), a wafer-level fabricated package (WFP), or a wafer-level stack package (WSP).

In some embodiments, the data storage device 10 may include a nonvolatile memory device 100 and a controller 200.

In some embodiments, the controller 200 may control an overall operation of the data storage device 10 through the execution of firmware or software. For example, the firmware or software may be stored in the nonvolatile memory device 100 and may be loaded into a memory (for example, first buffer memory 230) in the controller 200 during booting of the data storage device 10. The controller 200 may be implemented with hardware or a combination of hardware and software.

In some embodiments, the controller 200 may include a host interface 210, a processor 220, a first buffer memory 230, an error correction code (ECC) circuit 240, an exclusive OR (XOR) operation circuit 250, a recovery circuit 260, and a memory interface 270.

In an example, the host interface 210 may interface between a host and the data storage device 10 according to a host protocol. For example, the host interface 210 may communicate with the host through a protocol that includes a USB protocol, a UFS protocol, an MMC protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-e protocol.

In another example, the processor 220 may include a micro control unit (MCU) and/or a central processing unit (CPU). The processor 220 may process a request transmitted from the host. To process the request transmitted from the host, the processor 220 may execute a code-type instruction or algorithm (for example, firmware) loaded into the first buffer memory 230 and control internal function blocks such as the host interface 210, the first buffer memory 230, the ECC circuit 240, the XOR operation circuit 250, the recovery circuit 260, the memory interface 270, and the nonvolatile memory device 100.

In yet another example, the processor 220 may generate control signals for controlling an operation of the nonvolatile memory device 100 based on the requests transmitted from the host, and further provide the generated control signals to the nonvolatile memory device 100 through the memory interface 270.

In yet another example, the first buffer memory 230 may include a static random access memory (SRAM), but this is not limited thereto. The firmware executed by the processor 220 may be loaded into the first buffer memory 230. The first buffer memory 230 may store data (for example, metadata) required for executing the firmware. For example, the first buffer memory 230 may be operate as a working memory of the processor 220. In an embodiment, the firmware executed by the processor 220 and the metadata required for the executing the firmware may be loaded into a memory (not shown in FIG. 1) separately coupled to the processor 220 from the first buffer memory 230.

In yet another example, the first buffer memory 230 may store an XOR parity used and/or generated by the XOR operation circuit 250. The XOR parity may include a plurality of bits generated through performing of an XOR operation on program data to be stored in the nonvolatile memory device 100. For example, the XOR parity may be a parity generated through performing of an XOR operation on program data having a predetermined size or length. The XOR parity may be used for the read fail recovery operation which corrects an error of read-failed data in read fail occurrence. Here, the read fail may refer to an ECC decoding failure of read data read out from the nonvolatile memory device 100.

In yet another example, the ECC circuit 240 may perform an ECC encoding operation which generates parity data of program data to be transmitted from a host to the nonvolatile memory device 100. The ECC circuit 240 may also perform an ECC decoding operation which has the ability to detect and correct an error of the read data read out from the nonvolatile memory device 100 based on the parity data corresponding to the read data.

For example, the ECC circuit 240 may generate the parity data by ECC-encoding the program data received from the host and provide encoded data including the program data and the parity data to the nonvolatile memory device 100 through the memory interface 270. The ECC circuit 240 may detect and correct an error included in the read data using the parity data included in the encoded data read out from the nonvolatile memory device 100 in response to a read request of the host. The ECC circuit 240 may correct the error when a number of detected error bits is less than or equal to a predefined number of error corresponding to the error-correcting capability of the ECC circuit 240 The ECC circuit 240 may provide the error-corrected data to the host through the host interface 210.

In yet another example, the XOR operation circuit 250 may generate the XOR parity for the program data by performing an XOR operation on the program data having a predetermined size or length. When the parity bit generated in the ECC circuit 240 is a parity bit of the program data corresponding to a minimum program unit, the XOR parity generated in the XOR operation circuit 250 may be a parity bit for a data group including two or more program data of the minimum program unit. For example, the parity bit may be used in performing an ECC decoding operation on the read data read out from the nonvolatile memory device 100 and the XOR parity may be used in performing a recovery operation for recovering an error of the read data (for example, read-failed data) in the event of an ECC decoding failure.

In yet another example, the XOR operation circuit 250 may generate the XOR parity for the program data temporarily stored in a second buffer memory 280 and transmit the generated XOR parity to the first buffer memory 230. The first buffer memory 230 may store the XOR parity transmitted from the XOR operation circuit 250.

In yet another example, the recovery circuit 260 may be configured to recover from an error of the read data (for example, the read-failed data) in the event of an ECC decoding failure. For example, the recovery circuit 260 may recover the error of the read-failed data by performing an XOR operation on the remaining data other than the read-failed data in a data group including the read-failed data and an XOR parity corresponding to the corresponding data group.

In yet another example, the memory interface 270 may control the nonvolatile memory device 100 based on instructions from the processor 220. The memory interface 270 may refer to a memory controller. The memory interface 270 may provide control signals to the nonvolatile memory device 100. The control signals may include a command CMD, an address ADDR, an operation control signal (CTRL), and the like for controlling the nonvolatile memory device 100. The memory interface 270 may provide data (for example, program data) to the nonvolatile memory device 100 or receive data (for example, read data) from the nonvolatile memory device 100.

In yet another example, the second buffer memory 280 may be configured to include a data buffer (DB) (not shown in FIG. 1) which temporarily stores program data which is to be transmitted from a host to the nonvolatile memory device 100 or read data which is read out from the nonvolatile memory device 100 and to be transmitted to the host. The second buffer memory 280 may include a dynamic random access memory (DRAM), but this is not limited thereto.

In some embodiments, as illustrated in FIG. 1, the second buffer memory 280 is positioned outside of the controller 200. In other embodiments, the second buffer memory 280 may be located inside the controller 200. The program data temporarily stored in the second buffer memory 280 may be retained in the second buffer memory 280 until the storage of the program data in the nonvolatile memory device 100 is completed.

In yet another example, the nonvolatile memory device 100 may operate as a storage medium for the data storage device 10. The nonvolatile memory device 100 may be one of various types of nonvolatile memory devices, which include, but are not limited to, a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (RERAM) using a transition metal compound.

FIG. 2 is a diagram illustrating an example configuration of the nonvolatile memory device 100 of FIG. 1.

As shown in FIG. 2, the nonvolatile memory device 100 may include a memory cell array 110, a row decoder 120, a program/read circuit 130, a column decoder 140, a page buffer 150, a voltage generator 160, a control logic 170, and an input/output (I/O) circuit 180.

In an example, the memory cell array 110 may include a plurality of memory cells (not shown in FIG. 2) arranged in regions in which a plurality of word lines (WL) and a plurality of bit lines (BL) cross each other perpendicularly.

Each of the memory cells in the memory cell array 110 may be at least one of a single level cell (SLC), in which a single bit data (for example, 1-bit data) is to be stored, a multi-level cell (MLC) in which 2-bit data is to be stored, a triple level cell (TLC) in which 3-bit data is to be stored, and a quadruple level cell (QLC) in which 4-bit data is to be stored. The memory cell array 110 may include at least one or more memory cells from among the group that includes the SLC, the MLC, the TLC, and the QLC. The memory cell array 110 may include memory cells arranged in a two-dimensional (2D) horizontal structure or memory cells arranged in a 3D vertical structure.

The row decoder 120 may be coupled to the memory cell array 110 through the word lines WL. The row decoder 120 may be operated according to control of the control logic 170. The row decoder 120 may decode a row address X_ADDR provided from the control logic 170 and select and drive at least one word line WL of the word lines WL based on a decoding result. The row decoder 120 may provide an operation voltage Vop provided from the voltage generator 160 to the selected word line WL.

The program/read circuit 130 may be coupled to the memory cell array 110 through the bit lines BL. The program/read circuit 130 may include program/read circuits (not shown in FIG. 2) corresponding to the bit lines BL. The program/read circuit 130 may be operated according to control of the control logic 170. The program/read circuit 130 may include a program driver WD configured to program data in the memory cells and a sense amplifier SA configured to amplify data read from the memory cells. The program/read circuit 130 may perform a program and read operations on selected memory cells by providing a current pulse or a voltage pulse to the memory cells selected through the row decoder 120 and the column decoder 140 among the memory cells of the memory cell array 110.

The column decoder 140 may be operated according to control of the control logic 170. The column decoder 140 may decode a column address Y_ADDR provided from the control logic 170. The column decoder 140 may couple the program/read circuits of the program/read circuit 130 corresponding to the bit lines BL to the page buffer 150 based on a decoding result.

The page buffer 150 may be configured to temporarily store data which is provided from the memory interface 270 of the controller 200 and is to be programmed in the memory cell array 110, and data which is read out from the memory cell array 110 and is to be provided to the memory interface 270 of the controller 200. The page buffer 150 may be operated according to control of the control logic 170.

The voltage generator 160 may generate various voltages for performing a program, read, and erase operations on the memory cell array 110 based on a voltage control signal CTRL_vol provided from the control logic 170. The voltage generator 160 may generate driving voltages Vop for driving the plurality of word lines WL and the plurality of bit lines BL. The voltage generator 160 may generate at least one or more reference voltages for reading out data stored in a memory cell MC.

The control logic 170 may output various control signals for programming data DATA in the memory cell array 110 or reading out data DATA from the memory cell array 110, based on a command CMD, an address ADDR, or a control signal CTRL received from the controller 200. The various control signals output from the control logic 170 may be provided to the row decoder 120, the program/read circuit 130, the column decoder 140, the page buffer 150, and the voltage generator 160. Accordingly, the control logic 170 may entirely control the various operations performed in the nonvolatile memory device 100.

For example, the control logic 170 may generate an operation control signal CTRL_op based on the command CMD and the control signal CTRL and provide the generated operation control signal CTRL_op to the program/read circuit 130. The control logic 170 may provide the row address X_ADDR and the column address Y_ADDR included in the address ADDR to the row decoder 120 and the column decoder 140.

The I/O circuit 180 may be configured to receive the command CMD, the address ADDR, and the data DATA provided from the controller 200 or provide the data DATA read out from the memory cell array 110 to the controller 200. The I/O circuit 180 may output the command CMD and the address ADDR received from the controller 200 to the control logic 170 and output the data DATA received from the controller 200 to the page buffer 150. The I/O circuit 180 may output data DATA received from the page buffer 150 to the controller 200. The I/O circuit 180 may be operated according to control of the control logic 170.

Figure 3A:
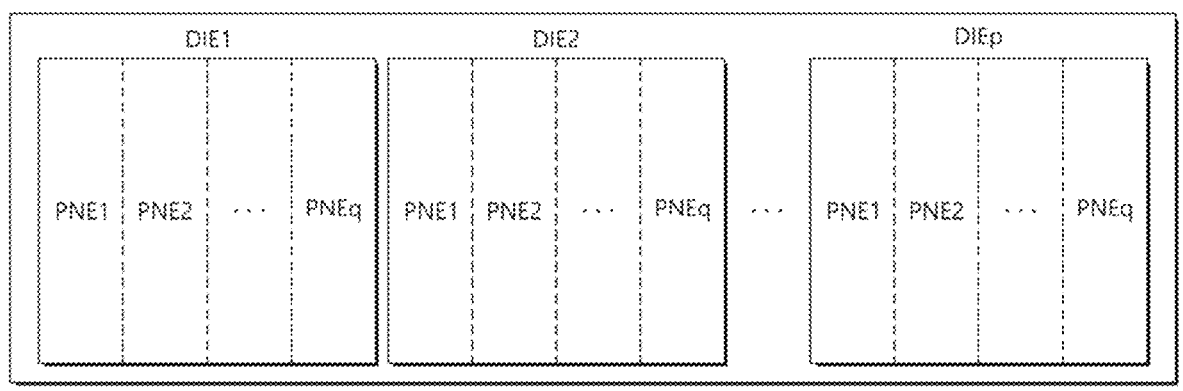
FIG. 3A is a diagram illustrating an exemplary configuration of a memory cell array, based on an embodiment of the presently disclosed technology.
Figure 3B:
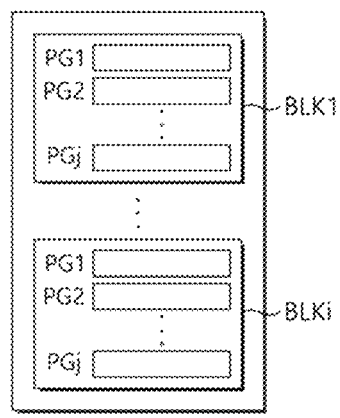
FIG. 3B is a diagram illustrating an exemplary configuration of a plane of FIG. 3A.

FIG. 3A is a diagram illustrating an example configuration of a memory cell array 110, based on an embodiment of the disclosed technology, and FIG. 3B is a diagram illustrating an example configuration of a plane of FIG. 3A.

As shown in FIG. 3A, the memory cell array 110 may include a plurality of dies, denoted DIE1 to DIEp. In some embodiments, the dies DIE1 to DIEp may be memory chips. Each of the plurality of dies DIE1 to DIEp may include a plurality of planes PNE1 to PNEq. As shown in FIG. 3B, each of the plurality of planes PNE1 to PNEq may include a plurality of memory blocks BLK1 to BLKi and each of the plurality of memory blocks BLK1 to BLKi may include a plurality of pages PG1 to PGj.

Figure 4A:
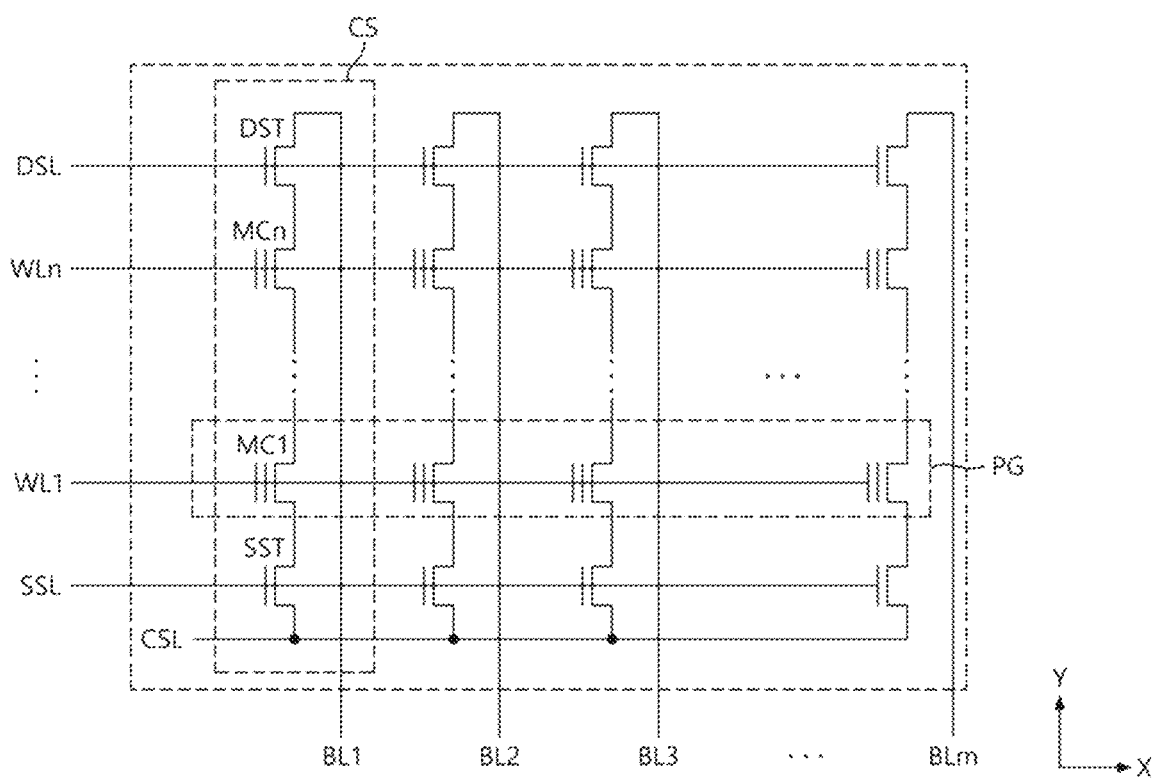
FIG. 4A is a circuit diagrams illustrating an example of memory blocks, based on an embodiment of the presently disclosed technology.
Figure 4B:
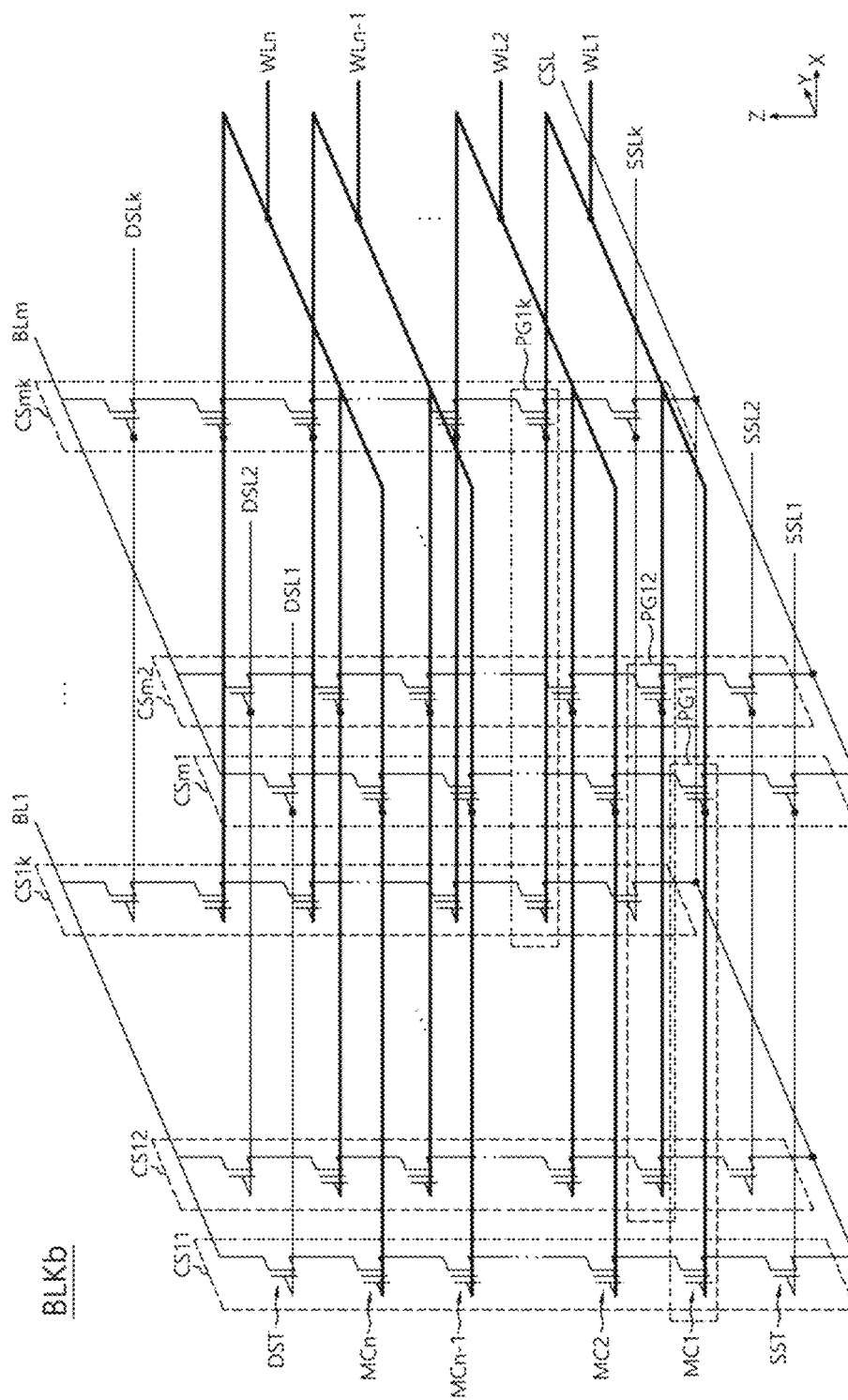
FIG. 4B is a circuit diagram illustrating another example of memory blocks, based on an embodiment of the presently disclosed technology.

FIGS. 4A and 4B are circuit diagrams illustrating examples of memory blocks, based on embodiments of the disclosed technology. FIG. 4A is a circuit diagram illustrating an example of a memory block BLKa, which includes memory cells arranged in a 2D manner, and FIG. 4B is a circuit diagram illustrating another example of a memory block BLKb, which includes memory cells arranged in a 3D manner. For example, each of the memory blocks BLK1 to BLKi illustrated in FIG. 3B may be implemented using the circuit illustrated in FIG. 4A or 4B, but the configuration of the memory block is not limited thereto.

As shown in FIG. 4A, the memory block BLKa may have a 2D horizontal structure. For example, the memory block BLKa may include a plurality of bit lines BL1 to BLm arranged to be spaced in a first direction and a plurality of word lines WL1 to WLn arranged to be spaced in a second direction that is substantially perpendicular to the first direction. In an example, the first direction may be an X-axis direction and the second direction may be a Y-axis direction. In another example, the first direction may be the Y-axis direction and the second direction may be the X-axis direction.

The memory block BLKa may include a plurality of cell strings CS coupled to the plurality of bit lines BL1 to BLm. In an example, the cell strings CS may have the same circuit configuration as each other. For clarity, the memory block BLKa will be described in the context of a single cell string CS.

The cell string CS may include a plurality of memory cells MC1 to MCn and drain and source select transistors (DST and SST, respectively) coupled between the bit line BL1 and a common source line CSL. For example, the cell string CS may include the drain select transistor DST coupled to a drain select line DSL, the plurality of memory cells MC1 to MCn coupled to the plurality of word lines WL1 to WLn, and the source select transistor SST coupled to a source select line SSL.

As shown in FIG. 4A, a plurality of memory cells coupled to the same word line may referred to as a page (PG) unit. The program operation or the read operation may be simultaneously performed on the plurality of memory cells coupled to the same word line, but this is not limited thereto.

As shown in FIG. 4B, the memory block BLKb may have a 3D vertical structure.

In some embodiments, the memory block BLKb may include a plurality of bit lines BL1 to BLm arranged to be spaced in a first direction, a plurality of cell strings CS11 to CS1*k*~CSm1 to CSm*k* coupled to the plurality of bit lines BL1 to BLm and arranged to be spaced in a second direction, and a plurality of word lines WL1 to WLn arranged to be spaced in a third direction (with the first, second and third directions being substantially perpendicular to each other). In an example, the first direction may be an X-axis direction, the second direction may be a Y-axis direction, and the third direction may be a Z-axis direction, but this is not limited thereto.

In an example, K cell strings may be coupled to each of m bit lines and thus m×k cell strings may be arranged in the memory block BLKb. Here, n, m, and k are integers greater than or equal to 1.

In another example, each of the plurality of cell strings CS11 to CS1*k*~CSm1 to CSm*k* may include at least one source select transistor SST, first to n-th memory cells MC1 to MCn, and at least one drain select transistor DST. The source select transistor SST in each cell string may be coupled between the common source line CSL and the memory cells MC1 to MCn.

In yet another example, source select transistors SST of cell strings arranged on the same line in the X-axis direction may be coupled to the same source select line. For example, the source select transistors SST of a plurality of first cell strings CS11 to CSm1 coupled to the bit lines BL1 to BLm may be coupled to a first source select line SSL1. Similarly, the source select transistors SST in the plurality of second to k-th cell strings CS12 to CSm2~CS1*k* to CSm*k* coupled to the bit lines BL1 to BLm may be coupled to second to k-th source select lines SSL2 to SSLk.

In yet another example, drain select transistors DST of the cell strings arranged on the same line in the X-axis direction may be coupled to the same drain select line. For example, the drain select transistors DST of the plurality of first cell strings CS11 to CSm1 coupled to the bit lines BL1 to BLm may be coupled to a first drain select line DSL1. Similarly, the drain select transistors DST in the plurality of second to k-th cell strings CS12 to CSm2~CS1*k* to CSm*k* coupled to the bit lines BL1 to BLm may be coupled to second to k-th drain select lines DSL2 to DSLk.

In yet another example, the first to n-th memory cells MC1 to MCn in each of the plurality of cell strings CS11 to CS1*k*~CSm1 to CSm*k* may be coupled in series between the source select transistor SST and the drain select transistor DST.

In yet another example, the first to n-th memory cells MC1 to MCn in each of the plurality of cell strings CS11 to CS1*k*~CSm1 to CSm*k* may be coupled to first to n-th word lines WL1 to WLn. The memory cells coupled to the cell strings arranged on the same line in the X-axis direction and coupled to the same word line may be referred to as a page (PG) unit.

In yet another example, as shown in FIG. 4B, the first memory cells MC1 coupled to the first cell strings CS11 to CSm1 arranged on the same line in the X-axis direction and coupled to the first word line WL1 may refer to a first-first page PG11. Similarly, the first memory cells MC1 coupled to the second to k-th cell strings CS12 to CSm2~CS1*k* to CSm*k* arranged on the same line in the X-axis direction and coupled to the first word line WL1 may refer to first-second to first-k-th pages PG12 to PG1*k*. For example, in the 3D vertical structure illustrated in FIG. 4B, a plurality of pages may be coupled to one word line, but this is not limited thereto.

In yet another example, K pages may be coupled to each of the word lines WL1 to WLn and thus n×k pages may be arranged in the memory block BLKb. The number of pages in each of the word lines WL1 to WLn may be changed according to the number of cell strings coupled to each of the bit lines BL1 to BLm.

An exemplary program operation for the memory block having the 3D vertical structure illustrated in FIG. 4B will now be described.

Figure 5A:
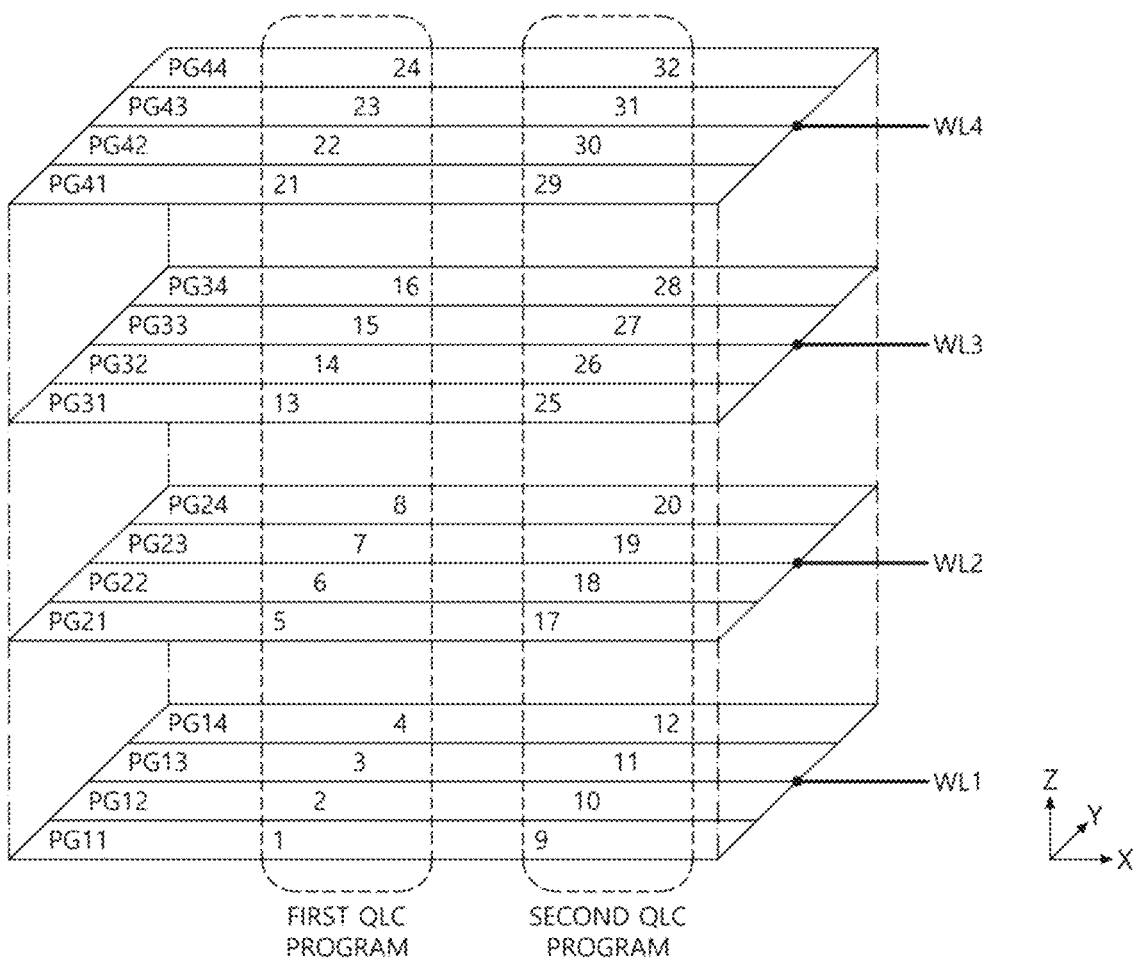
FIG. 5A is a diagram illustrating an example of quadruple level cell (QLC) program operations, based on an embodiment of the presently disclosed technology.
Figure 5B:
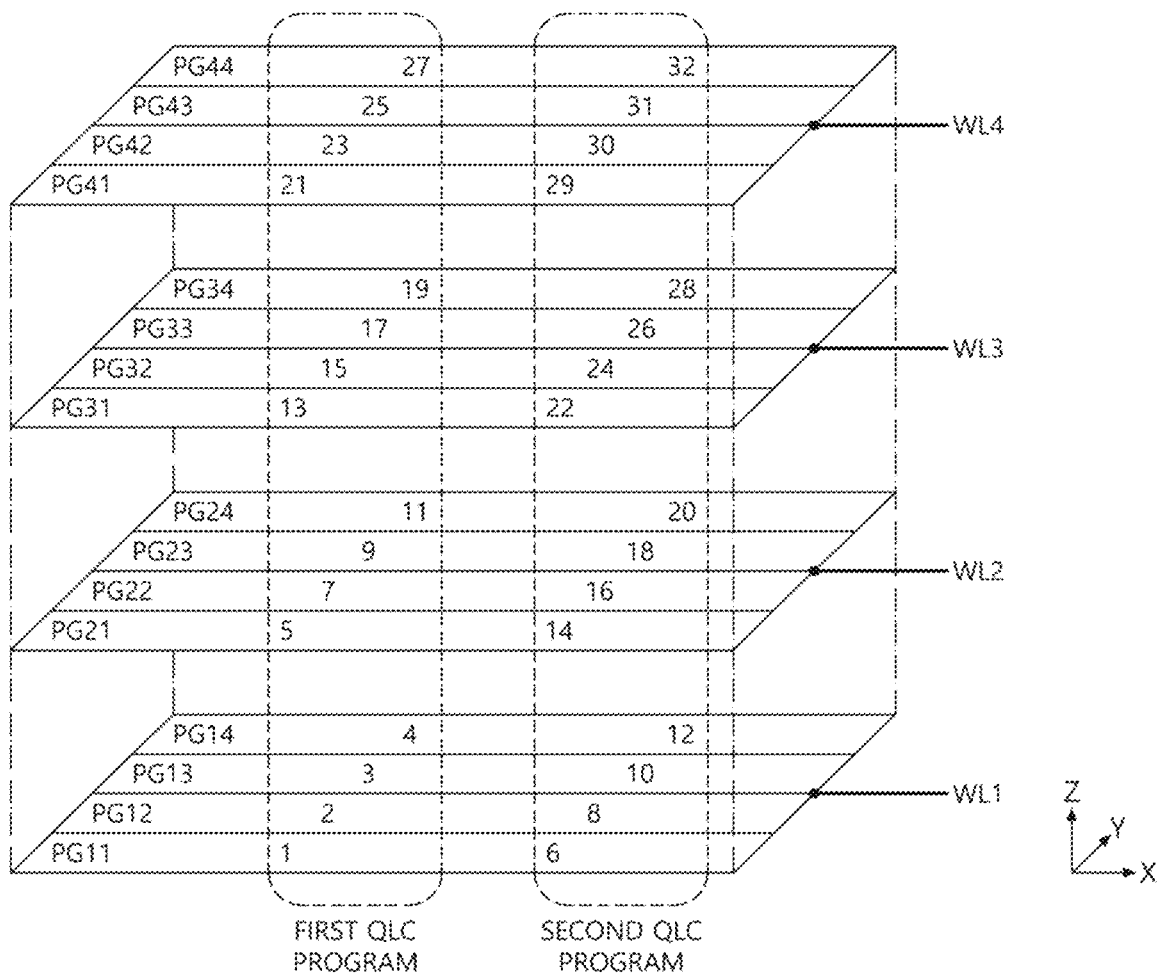
FIG. 5B is a diagram illustrating another example of quadruple level cell (QLC) program operations, based on an embodiment of the presently disclosed technology.

FIGS. 5A and 5B are diagrams illustrating an example QLC program operation, based on embodiments of the disclosed technology. For simplification of the drawings and convenience of the description, it is assumed that a memory block BLKo includes four word lines WL1 to WL4 and four pages sets PG11 to PG14, PG21 to PG24, PG31 to PG34, and PG41 to PG44 are coupled to the four word lines WL1 to WL4. For example, the four first pages PG11 to PG14 may be coupled to the first word line WL1, four second pages PG21 to PG24 may be coupled to the second word line WL2, four third pages PG31 to PG34 may be coupled to the third word line WL3, and four fourth pages PG41 to PG44 may be coupled to the fourth word line WL4.

As shown in FIG. 5A, the QLC program operation for the memory block BLKo may start from the first-first page PG11 of the first word line WL1 and may be terminated in the fourth-fourth page PG44 of the fourth word line WL4.

In an example, the QLC program operation on the memory block BLKo may be performed in order of the first QLC program (1, 2, 3, 4) for the first pages PG11 to PG14 of the first word line WL1, followed by the first QLC program (5, 6, 7, 8) for the second pages PG21 to PG24 of the second word line WL2, followed by the second QLC program (9, 10, 11, 12) for the first pages PG11 to PG14 of the first word line WL1, followed by the first QLC program (13, 14, 15, 16) for the third pages PG31 to PG34 of the third word line WL3, followed by the second QLC program (17, 18, 19, 20) for the second pages PG21 to PG24 of the second word line WL2, followed by the first QLC program (21, 22, 23, 24) for the fourth pages PG41 to PG44 of the fourth word line WL4, followed by the second QLC program (25, 26, 27, 28) for the third pages PG31 to PG34 of the third word line WL3, and finally the second QLC program (29, 30, 31, 32) for the fourth pages PG41 to PG44 of the fourth word line WL4. Accordingly, the QLC program operation for all the pages PG11 to PG44, coupled to the first to fourth word lines WL1 to WL4, may be normally completed.

In this example, the first QLC program operation performed on the first to fourth word lines WL1 to WL4 may be referred to as a foggy (or coarse) program operation and the second QLC program operation performed on the first to fourth word lines WL1 to WL4 may be referred to as a fine program operation. With respect to the same page, data to be stored in the first QLC program operation and data to be stored in the second QLC program operation may be the same as each other, but this is not limited thereto.

As the capacity of the nonvolatile memory device 100 increases, the amount of data to be stored in one memory cell also increases. In recent years, the use of a quadruple level cell (QLC) method which stores four-bit data in one memory cell has increased. With the increased integration of the memory cell array 100, the space between signal lines (word lines and bit lines) is being reduced. This causes interference, due to a word line on which the program operation is being performed, with other word lines adjacent thereto, for example, a previous word line to which the program operation is completed. As a result, the data pre-stored in memory cells coupled to the previous word line may be corrupted. For example, the corruption of the pre-stored data may mean that the threshold voltage distributions of the memory cells coupled to the previous word line are deformed.

To reform (or reconstitute) the threshold voltage distributions of first memory cells coupled to a first word line to the desired threshold voltage distributions for performing QLC operations, an exemplary QLC program operation has to be performed. This exemplary QLC program operation includes a first QLC program operation (for example, foggy program operation) which stores a first data in the first memory cells coupled to the first word line, another first QLC program operation (for example, foggy program operation) which stores a second data in second memory cells coupled to a word line (for example, a second word line) next to the first word line, and then a second QLC program operation (for example, fine program operation) which stores the first data in the first memory cells of the first word line again.

Figure 6A:
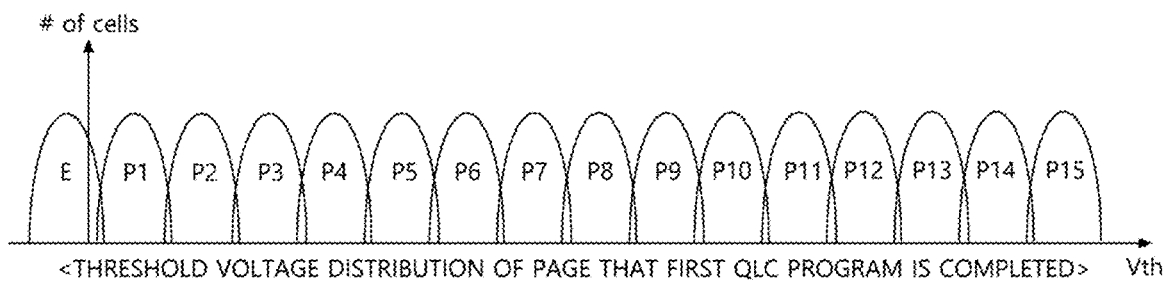
FIG. 6A is a diagram illustrating an example of a threshold voltage distribution of a page to which a first QLC program operation is completed, based on an embodiment of the presently disclosed technology.
Figure 6B:
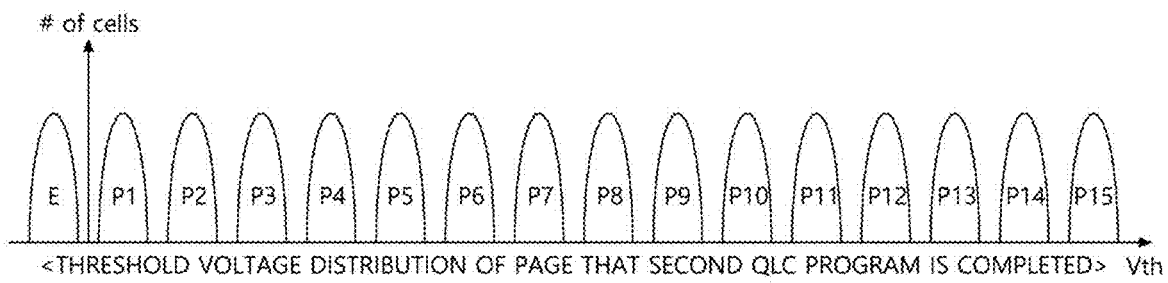
FIG. 6B is a diagram illustrating another example of a threshold voltage distribution of a page to which a second QLC program operation is completed, based on an embodiment of the presently disclosed technology.

For example, the threshold voltage distributions of the memory cells on which the first QLC program operation is performed may not be clearly distinguishable from each other as illustrated in FIG. 6A. For example, the threshold voltage distributions of the memory cells may overlap with each other. The threshold voltage distributions of the memory cells on which the second QLC program operation is performed may be clearly distinguished from each other as illustrated in FIG. 6B. The threshold voltage distributions of the memory cells may be completely separated from each other without any overlapping portion.

Accordingly, since the threshold voltage distributions of the memory cells coupled to a previous word line are deformed due to the interference by the program operation performed on next word line, the first QLC program operation on the previous word line may be performed so that the threshold voltage distributions of the memory cells are close to the desired form, the first QLC program operation on the next word line may be performed, and then the second QLC program operation, which programs the same data in the previous word line again, may be performed on the previous word line so that the threshold voltage distributions of the memory cells coupled to the previous word line may reach the desired form.

As shown in FIG. 5B, the QLC program operation for the memory block BLKo may start from the first-first page PG11 of the first word line WL1 and may be terminated in the fourth-fourth page PG44 of the fourth word line WL4, similar to the QLC program operation shown in FIG. 5A. However, the QLC program operation shown in FIG. 5B is different from the QLC program operation of FIG. 5A in that the QLC program method of FIG. 5B sequentially performs the first QLC program operation on a plurality of pages (for example, the first pages PG11 to PG14) coupled to a first word line (for example, the first word line WL1) and then alternately performs the first QLC program operation (or the second QLC program operation) on a plurality of pages coupled to next word line and a plurality of pages coupled to a previous word line one page by one page.

In an example, referring to FIG. 5B, the QLC program operation on the memory block BLKo may be performed in order of the first QLC program (1, 2, 3, 4) for the first pages PG11 to PG14 of the first word line WL1, followed by the first QLC program (5) for the second-first page PG21 of the second word line WL2, followed by the second QLC program (6) for the first-first page PG11 of the first word line WL1, followed by the first QLC program (7) for the second-second page PG22 of the second word line WL2, followed by the second QLC program (8) for the first-second page PG12 of the first word line WL1, followed by the first QLC program (9) for the second-third page PG23 of the second word line WL2, followed by the second QLC program (10)

for the first-third page PG13 of the first word line WL1, followed by the first QLC program (11) for the second-fourth page PG24 of the second word line WL2, and finally the second QLC program (12) for the first-fourth page PG14 of the first word line WL1.

In another example, the QLC program operation on the memory block BLKo may be performed in order of the first QLC program (13) for the third-first page PG31 of the third word line WL3, followed by the second QLC program (14) for the second-first page PG21 of the second word line WL2, followed by the first QLC program (15) for the third-second page PG32 of the third word line WL3, followed by the second QLC program (16) for the second-second page PG22 of the second word line WL2, followed by the first QLC program (17) for the third-third page PG33 of the third word line WL3, followed by the second QLC program (18) for the second-third page PG23 of the second word line WL2, followed by the first QLC program (19) for the third-fourth page PG34 of the third word line WL3, and finally the second QLC program (20) for the second-fourth page PG24 of the second word line WL2.

In yet another example, the QLC program operation on the memory block BLKo may be performed in order of the first QLC program (21) for the fourth-first page PG41 of the fourth word line WL4, followed by the second QLC program (22) for the third-first page PG31 of the third word line WL3, followed by the first QLC program (23) for the fourth-second page PG42 of the fourth word line WL4, followed by the second QLC program (24) for the third-second page PG32 of the third word line WL3, followed by the first QLC program (25) for the fourth-third page PG43 of the fourth word line WL4, followed by the second QLC program (26) for the third-third page PG33 of the third word line WL3, followed by the first QLC program (27) for the fourth-fourth page PG44 of the fourth word line WL4, followed by the second QLC program (28) for the third-fourth page PG34 of the third word line WL3, and finally the second QLC program (29, 30, 31, 32) for the fourth-first to fourth-fourth pages PG41-PG44 of the fourth word line WL4. In some embodiments, the program operation illustrated in FIG. 5A may refer to a four-string program operation and the program operation illustrated in FIG. 5B may refer to one-string program operation.

Figure 7A:
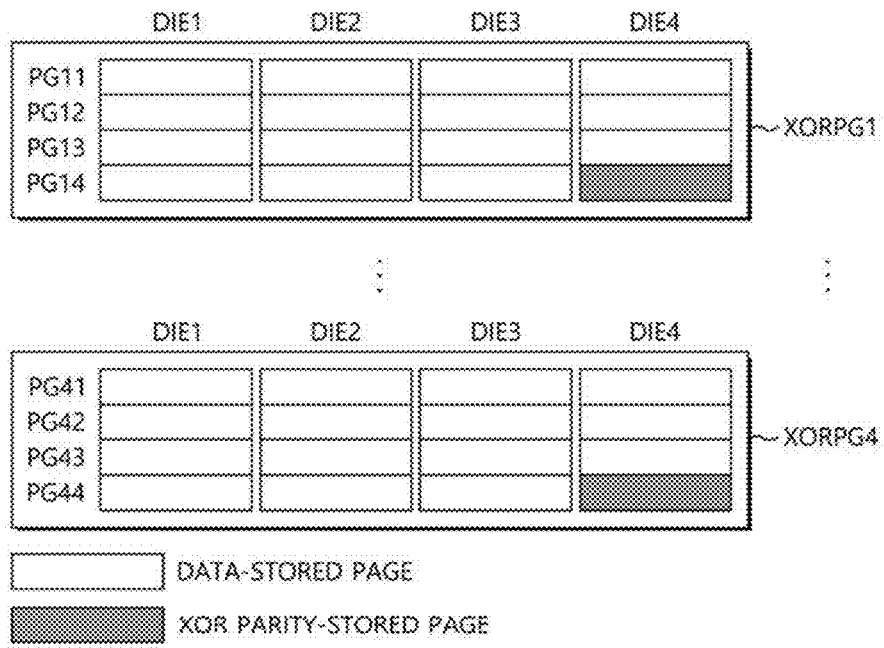
FIG. 7A is a diagram illustrating an example of configurations of page groups, based on an embodiment of the presently disclosed technology.
Figure 7B:
FIG. 7B is a diagram illustrating another example of a configuration of page groups, based on an embodiment of the presently disclosed technology.

FIGS. 7A and 7B are diagrams illustrating example configurations of a page group, based on embodiments of the disclosed technology. For simplification of the drawings and convenience of the description, it is assumed that the memory cell array 110 includes four dies DIE1 to DIE4, each of the four dies DIE1 to DIE4 includes one plane which includes one memory block, and the memory block in each of the four dies DIE1 to DIE4 includes a plurality of pages PG11 to PG14, PG21 to PG24, PG31 to PG34, and PG41 to PG44. For example, it is assumed that each of the first to fourth dies DIE1 to DIE4 is configured of one memory block including the plurality of pages PG11 to PG14, PG21 to PG24, PG31 to PG34, and PG41 to PG44.

As shown in FIG. 7A, the memory cell array 110 may include four page groups XORPG1 to XORPG4. Each of the four page groups XORPG1 to XORPG4 may include 16 pages. For example, the first page group XORPG1 may include the first pages PG11 to PG14 of the first die DIE1, the first pages PG11 to PG14 of the second die DIE2, the first pages PG11 to PG14 of the third die DIE3, and the first pages PG11 to PG14 of the fourth die DIE4. For example, in the context of FIGS. 5A and 5B, the first page group XORPG1 may be configured to include four first pages PG11 to PG14 coupled to the first word line WL1 in each of the first to fourth dies DIE1 to DIE4 and the fourth page group XORPG4 may be configured to include four fourth pages PG41 to PG44 coupled to the fourth word line WL4 in each of the first to fourth dies DIE1 to DIE4. In some embodiments, and although not shown in FIG. 7A, the second and third page groups may be configured to have the same configuration as the first page group XORPG1. For example, the second page group XORPG2 may be configured to include four second pages PG21 to PG24 coupled to the second word line WL2 in each of the first to fourth dies DIE1 to DIE4 and the third page group XORPG3 may be configured to include four third pages PG31 to PG34 coupled to the third word line WL3 in each of the first to fourth dies DIE1 to DIE4.

When the page groups are configured to have the exemplary configuration illustrated in FIG. 7A, an XOR parity corresponding to data (for example, user data) stored in pages other than the last page of the last die DIE may be stored in the last page PG of the last die DIE among the plurality of pages included in each page group. For example, in the first page group XORPG1, the user data may be stored in the first pages PG11 to PG14 of the first to third dies DIE1 to DIE3 and the first-first to first-third pages PG11 to PG13 of the fourth die DIE4 and the XOR parity for the user data may be stored in the first-fourth page PG14 of the fourth die DIE4. Accordingly, the 'page group' described here may also be understood as the 'XOR parity group'.

As shown in FIG. 7B, the memory cell array 110 may include 16 page groups XORPG1 to XORPG16. Each of the 16 page groups XORPG1 to XORPG16 may include four pages.

For example, the first page group XORPG1 may include the first-first page PG11 of the first die DIE1, the first-first page PG11 of the second die DIE2, the first-first page PG11 of the third die DIE3, and the first-first page PG11 of the fourth die DIE4. Referring to FIGS. 5A, 5B and 7B, the first page group XORPG1 may be configured to include the first-first pages PG11 of the first pages PG11 to PG14 coupled to the first word line WL1 in the first to fourth dies DIE1 to DIE4, the second page group XORPG2 may be configured to include the first-second pages PG12 of the first pages PG11 to PG14 coupled to the first word line WL1 in the first to fourth dies DIE1 to DIE4, the third page group XORPG3 may be configured to include the first-third pages PG13 of the first pages PG11 to PG14 coupled to the first word line WL1 in the first to fourth dies DIE1 to DIE4, and the fourth page group XORPG4 may be configured to include the first-fourth pages PG14 of the first pages PG11 to PG14 coupled to the first word line WL1 in the first to fourth dies DIE1 to DIE4.

Referring to FIGS. 5A, 5B, and 7B, the 13-th page group XORPG13 may be configured to include the fourth-first pages PG41 of the fourth pages PG41 to PG44 coupled to the fourth word line WL4 in the first to fourth dies DIE1 to DIE4, the 14-th page group XORPG14 may be configured to include the fourth-second pages PG42 of the fourth pages PG41 to PG44 coupled to the fourth word line WL4 in the first to fourth dies DIE1 to DIE4, the 15-th page group XORPG15 may be configured to include the fourth-third pages PG43 of the fourth pages PG41 to PG44 coupled to the fourth word line WL4 in the first to fourth dies DIE1 to DIE4, and the 16-th page group XORPG16 may be configured to include the fourth-fourth pages PG44 of the fourth pages PG41 to PG44 coupled to the fourth word line WL4 in the first to fourth dies DIE1 to DIE4.

In some embodiments, and although not shown in FIG. 7B, the 5-th to 12-th page groups may be configured to have the same configuration as the first page group XORPG1.

In some embodiments, when the page groups are configured to have the configuration illustrated in FIG. 7B, the XOR parity corresponding to the user data stored in remaining pages other than a page of the last die DIE may be stored in the page PG of the last die DIE among the plurality of pages included in each page group. For example, in the first page group XORPG1, the user data may be stored in the first-first pages PG11 of the first to third dies DIE1 to DIE3 and the XOR parity for the user data may be stored in the first-first page PG11 of the fourth die DIE4.

The configurations of the page groups illustrated in FIGS. 7A and 7B are merely exemplary and may be modified according to the needs or design change. When the total size of the memory cell array 110 is limited, the number of pages included in the page group may be reduced as the number of page groups is increased and the number of pages included in the page group may be increased as the number of page groups is reduced.

Figure 8:
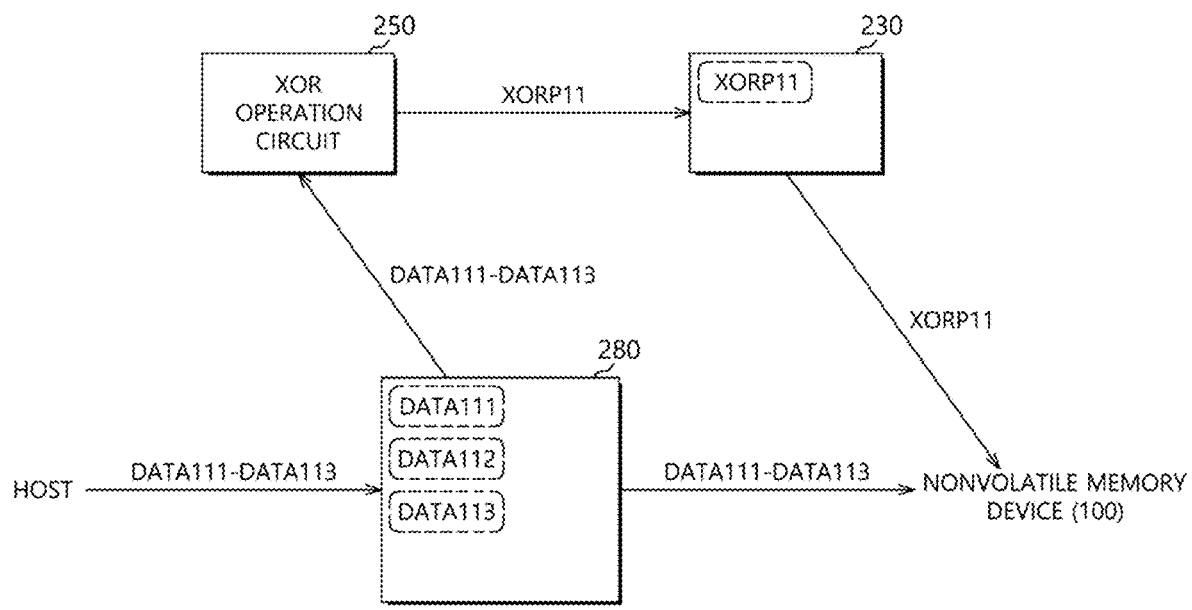
FIG. 8 is a diagram illustrating an example of a process of generating and storing an XOR parity for data and transmitting the data and the XOR parity to a nonvolatile memory device, based on an embodiment of the presently disclosed technology.

FIG. 8 is a diagram illustrating an example process of generating and storing an XOR parity for data and transmitting the data and the XOR parity to a nonvolatile memory device, based on an embodiment of the disclosed technology. This exemplary process is described with reference to FIG. 8 with FIG. 7B. For clarity, the page group has the example configuration shown in FIG. 7B.

As shown in FIG. 8, the second buffer memory 280 may store program data received from a host, for example, program data DATA111, DATA112, and DATA113 (hereinafter, referred to as 'first program data (or first data) DATA111', 'second program data (or second data) DATA112', and 'third program data (or third data) DATA113')) to be stored in the first-first pages PG11 of the first to third dies DIE1 to DIE3 in the first page group XORPG1. The second buffer memory 280 may sequentially transmit the first to third program data DATA111, DATA112, and DATA113 stored therein to the nonvolatile memory device 100. The second buffer memory 280 may retain the first to third program data DATA111, DATA112, and DATA113 stored therein until the storage of the first to third program data DATA111, DATA112, and DATA113 in the first-first pages PG11 of the first to third dies DIE1 to DIE3 in the first page group XORPG1 is completed and/or confirmed.

The XOR operation circuit 250 may generate an XOR parity XORP11 by performing an XOR operation on the first to third program data DATA111, DATA112, and DATA113 stored in the second buffer memory 280 and transmit the generated XOR parity XORP11 to the first buffer memory 230. In some embodiments, the XOR parity XORP11 may be an XOR-operated value of corresponding bits of the first to third program data DATA111, DATA112, and DATA113. Accordingly, the XOR parity XORP11 may comprise the same number of bits as that of each of the first to third program data DATA111, DATA112, and DATA113 (since XORP11 is a bit-wise XOR operation on the first, second and third program data).

The first buffer memory 230 may store the XOR parity XORP11 received from the XOR operation circuit 250. The first buffer memory 230 may transmit the stored XOR parity to the nonvolatile memory device 100. The first buffer memory 230 may retain the XOR parity XORP11 stored therein until the storage of the XOR parity XORP11 in the first-first page PG11 of the fourth die DIE4 in the first page group XORPG1 is completed and/or confirmed.

The nonvolatile memory device 100 may perform a program operation which stores the first to third program data DATA111, DATA112, and DATA113 received from the second buffer memory 280 in the first-first pages PG11 of the first to third dies DIE1 to DIE3 of the first page group XORPG1 and stores the XOR parity XORP11 received from the first buffer memory 230 in the first-first page PG11 of the fourth die DIE4 of the first page group XORPG1.

In some embodiments, and since the first to fourth dies DIE1 to DIE4 are physically separated from each other, the nonvolatile memory device 100 may not simultaneously program the first to third program data DATA111, DATA112, and DATA113 and the XOR parity XORP11 in the first-first pages PG11 of the first to fourth dies DIE1 to DIE4 and thus, may sequentially store the first to third program data DATA111, DATA112, and DATA113 and the XOR parity XORP11 in the first-first pages PG11 of the first to fourth dies DIE1 to DIE4 from the first-first page PG11 of the first die DIE1.

Figure 9A:
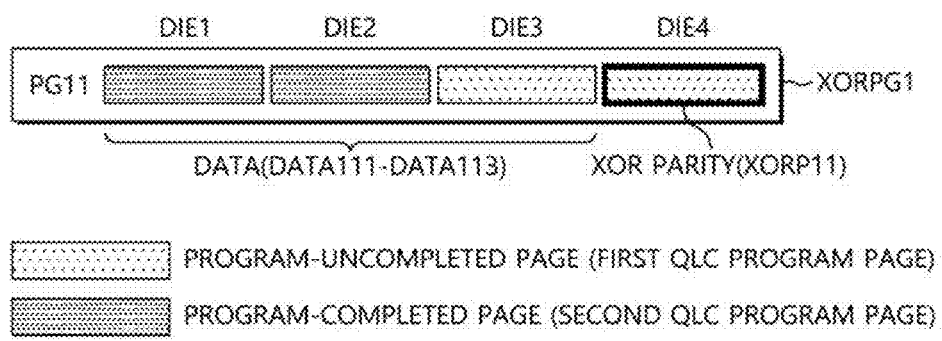
FIG. 9A is a diagram illustrating an example of a page group in which program-completed pages and program-in-progress pages are mixed, based on an embodiment of the presently disclosed technology.
Figure 9B:
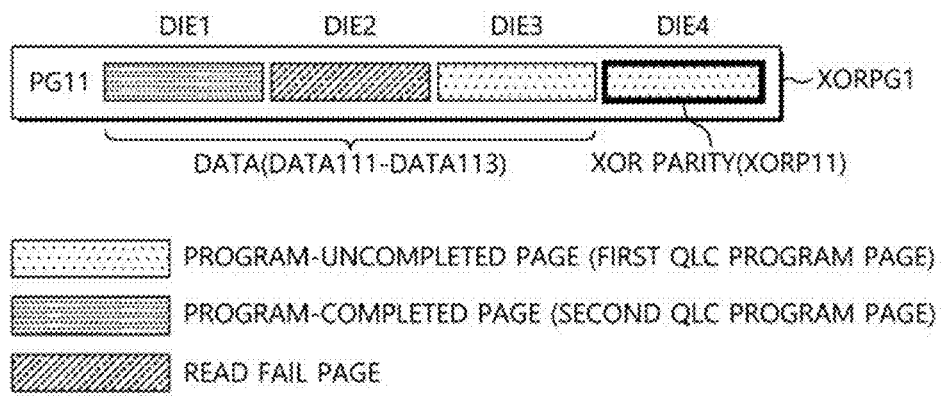
FIG. 9B is a diagram illustrating another example in which a read fail for program-completed pages occurs, based on an embodiment of the presently disclosed technology.

FIG. 9A is a diagram illustrating an example page group in which program-completed pages and program-in-progress pages are mixed, based on an embodiment of the disclosed technology. FIG. 9B is a diagram illustrating an example that read fail for program-completed pages occurs, based on an embodiment of the disclosed technology.

As shown in FIG. 9A, the first-first pages PG11 of the first and second dies DIE1 and DIE2 of the first page group XORPG1 may be 'program-completed pages' in which the storage of the first and second program data DATA111 and DATA112 is completed (denoted using a dense dotted pattern in FIG. 9A). In an example, the 'program-completed page' may refer to a page on which both the first QLC program (e.g., a foggy program operation) and the second QLC program (e.g., a fine program operation) have been performed. The first-first pages PG11 of the third and fourth dies DIE3 and DIE4 of the first page group XORPG1 may be 'program-in-progress pages' that the storage of the third program data DATA113 and the XOR parity XORP11 is not completed (denoted using a sparse dotted pattern in FIG. 9B). In an example, the 'program-in-progress page' may refer to a page on which only the first QLC program (e.g., a foggy program operation) is performed. In another example, the 'program-in-progress page' may refer to a page on which only a first of at least two or more first QLC programs (e.g., a foggy program operation) is performed.

The foggy and fine program operations are further elucidated later in the document in the context of FIG. 17.

Embodiments of the disclosed technology advantageously enable a read fail recovery operation (e.g., a chipkill recovery operation) to be performed efficiently and quickly even in the presence of program-in-progress pages by accessing the buffer memories that store the data and/or parity that is current being read from the program-in-progress pages. In other words, leveraging the available data and/or parity in the buffer memories (e.g., first buffer memory 230 and second buffer memory 280) ensures that the latency of the recovery operation is minimized since there is no need to wait for the program-in-process pages to becomes program-completed pages.

For example, it is assumed that a read request for the first-first page PG11 of the second die DIE2 of the first page group XORPG1 is received from a host.

Although not shown in FIGS. 9A and 9B, the controller 200 may generate, in response to the read request from the host, a read command for reading out the second data DATA112 from the first-first page PG11 of the second die DIE2 of the first page group XORPG1 and transmit the read command to the nonvolatile memory device 100. The nonvolatile memory device 100 may read the second data DATA112 from the first-first page PG11 of the second die DIE2 of the first page group XORPG1 based on the read command received from the controller 200 and transmit the read second data DATA112 to the controller 200.

The ECC circuit 240 of the controller 200 may perform ECC decoding on the second data DATA112 received from the nonvolatile memory device 100 and the controller 200 may transmit, upon an indication of ECC decoding success, the error-corrected second data DATA112 to the host when the ECC decoding is successful. On the other hand, when the ECC decoding fails, the controller 200 may determine that the read fail for the second data DATA112 has occurred and performs the read fail recovery operation for recovering the error of the second data DATA112 using the recovery circuit 260. For this example, the read fail for the second data DATA112 stored in the first-first page PG11 of the second die DIE2 of the first page group XORPG1 is illustrated in FIG. 9B.

Figure 10A:
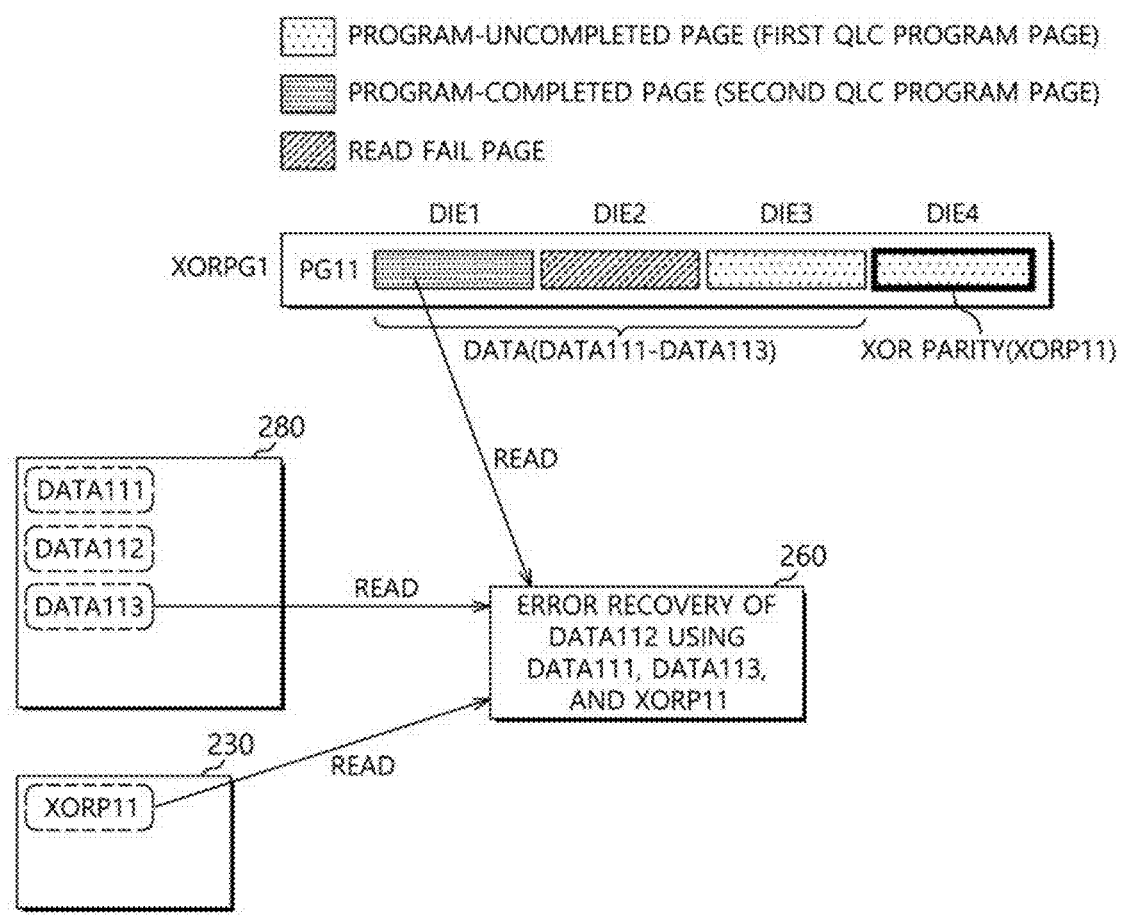
FIG. 10A is a diagram illustrating an example of read fail recovery operations of a recovery circuit, based on an embodiment of the presently disclosed technology.

FIG. 10A is a diagram illustrating an example of a read fail recovery operation of a recovery circuit, based on an embodiment of the disclosed technology. In a typical error recovery operation of the read-failed data, the data and the XOR parity stored in the remaining pages other than the page in which the read-failed data was stored (hereinafter, referred as 'read fail page') in the page group, including the read fail page, may be used in the error recovery operation. However, as illustrated in FIG. 10A, when the first page group XORPG1 is a page group that includes both program-completed pages and program-in-progress pages, the data stored in the program-in-progress page of the first page group XORPG1 may not be used in the error recovery of the read-failed second data DATA112.

In some embodiments, the error recovery on the read-failed second data DATA112 may be performed using only the data stored in the pages of the first page group XORPG1, and a second QLC program is being performed on the program-in-progress pages (e.g., the first-first page PG11 of the third die DIE3 and the first-first page PG11 of the fourth die DIE4 are being processed). In this case, the program operation on the program-in-progress pages in the first page group XORPG1 must be completed and only then the error recovery of the read-failed second data DATA112 may be performed. Thus, the time until the read fail recovery is completed may increase and the read fail recovery operation may be adversely affected (e.g., performed inefficiently).

Embodiments of the disclosed technology, when the program-in-progress pages are present in the page group including the read fail page, provide for the data and the XOR parity stored in the second buffer memory 280 and the first buffer memory 230 to be used in the read fail recovery operation as the data and the XOR parity corresponding to the program-in-progress pages. Thus, the read fail recovery operation may be performed more efficiently and quickly.

For example, and as shown in FIG. 10A, to perform the read fail recovery operation on the second data DATA112 stored in the first-first page PG11 of the second die DIE2 of the first page group XORPG1, the recovery circuit 260 has to read, from the first page group XORPG1, the first data DATA111 stored in the first-first page PG11 of the first die DIE1, the third data DATA113 stored in the first-first page PG11 of the third die DIE3, and the XOR parity stored in the first-first page PG11 of the fourth die DIE4.

Since the first-first pages PG11 of the third and fourth dies DIE3 and DIE4 of the first page group XORPG1 are the program-in-progress pages, the data of the corresponding first-first pages PG11 may not be used in the read fail recovery operation.

Accordingly, the recovery circuit 260 according to the embodiment may read the first data DATA111 from the first-first page PG11 of the first die DIE1 of the first page group XORPG1 in the memory cell array 110 of the nonvolatile memory device 100 and read the third data DATA113 and the XOR parity XORP11 from the second buffer memory 280 and the first buffer memory 230, respectively. For example, the data and the XOR parity stored in the pages for which the second QLC program is not completed may be read and used from the second buffer memory 280 and the first buffer memory 230 which stores (or retains) the corresponding data and XOR parity for the program-in-progress pages.

The recovery circuit 260 may recover an error of the read-failed second data DATA112 by performing an XOR operation on corresponding bits of the first data DATA111, the third data DATA113, and the XOR parity XORP11.

Figure 10B:
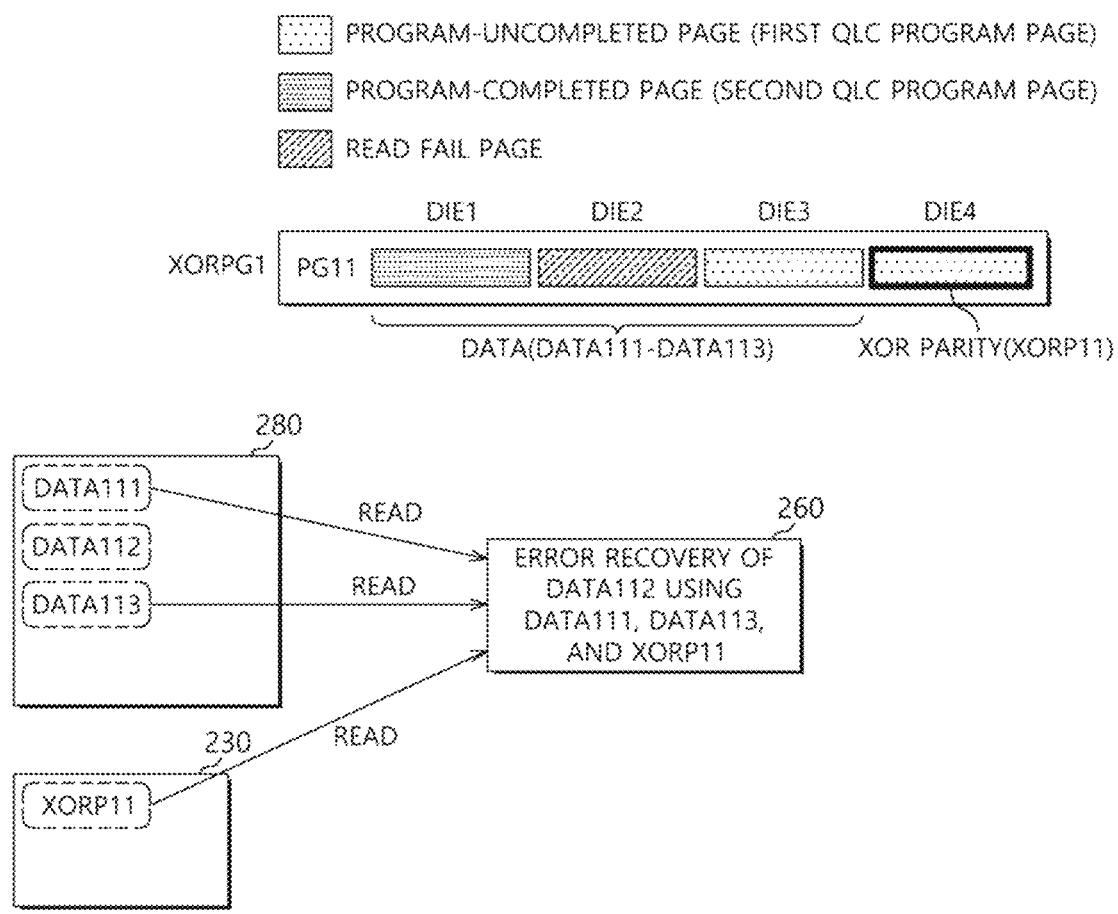
FIG. 10B is a diagram illustrating another example of read fail recovery operations of a recovery circuit, based on an embodiment of the presently disclosed technology.

FIG. 10B is a diagram illustrating another example of a read fail recovery operation of a recovery circuit, based on an embodiment of the disclosed technology. As shown in FIG. 10B, the recovery circuit 260 may perform the read fail recovery operation by reading out all the data (for example, the first data DATA111) of the program-completed page (for example, the first-first page PG11 of the first die DIE1) and the data (for example, the third data DATA113 and the XOR parity XORP11) of the program-in-progress pages (for example, the first-first pages PG11 of the third and fourth dies DIE3 and DIE4) from the buffer memories 230 and 280. In this case, the data of the program-completed page may not be deleted from the second buffer memory 280 and may be retained in the second buffer memory 280 until all the programs for the other pages of the same page group are completed.

FIG. 11 is a flowchart illustrating an exemplary operating method of a data storage device, based on an embodiment of the disclosed technology.

In operation S1101, the controller 200 may instruct the nonvolatile memory device 100 to perform a read operation in response to a read request received from a host. For example, the processor 220 of the controller 200 may generate a read command to be provided to the nonvolatile memory device 100 based on the read request received from the host and provide the generated read command to the nonvolatile memory device 100 through the memory interface 270. The nonvolatile memory device 100 may perform the read operation which reads out data from the memory cell array 110 according to the read command received from the controller 200 and provide the read data to the controller 200.

In operation S1103, the controller 200 may determine whether or not a read fail occurs during the read operation. For example, the ECC circuit 240 of the controller 200 may perform ECC decoding on the read data received from the nonvolatile memory device 100 through the memory interface 270. When the ECC decoding is successful, the ECC circuit 240 may provide information indicating that the ECC decoding is successful to the processor 220 and simultaneously may store the error-corrected read data in a read buffer (not shown) included in the first buffer memory 230 or the second buffer memory 280. When the ECC decoding has failed, the ECC circuit 240 may provide information indicating that the ECC decoding is failed to the processor 220. The processor 220 may determine whether or not the read fail occurs based on the information received from the ECC circuit 240. When it is determined that the read fail has not occurred, the process may proceed to operation S1119, wherein the read data is transmitted to the host. When it is determined that the read fail has occurred, the process may proceed to operation S1105.

In operation S1105, the processor 220 may determine whether or not the program-in-progress pages are present in a page group including a page (for example, read fail page) in which read-failed data is stored.

In operation S1107, the processor 220 may determine whether or not the program-in-progress pages are present in the page group including the read fail page based on the determination in operation S1105. When the program-in-progress pages are not present, the process may proceed to operation S1115. When the program-in-progress pages are present, the process may proceed to operation S1109.

In operation S1109, the processor 220 may instruct the recovery circuit 260 to read data and an XOR parity corresponding to the program-in-progress pages from the second buffer memory 280 as a data buffer and the first buffer memory 230 as an XOR parity buffer.

In operation S1111, the processor 220 may instruct the recovery circuit 260 to recover an error of read-failed data using data of the program-completed pages other than the read fail page in the page group including the read fail page, and the data and the XOR parity of the program-in-progress pages read from the first and second buffer memories 230 and 280 in operation S1109.

In some embodiments, the recovery circuit 260 may read the data of the program-completed pages from the nonvolatile memory device 100 or the second buffer memory 280 according to control of the processor 220. The recovery circuit 260 may recovery the error of the read-failed data by performing an XOR operation on corresponding bits of the data of the program-completed pages, and the data and the XOR parity of the program-in-progress pages. The recovery circuit 260 may store the error-recovered data in a read buffer (not shown) included in at least one of the first buffer memory 230 or the second buffer memory 280.

In operation S1113, the processor 220 may transmit the error-recovered data stored in the read buffer to the host through the host interface 210.

In operation S1115, the processor 220 may control the recovery circuit 260 to read data and an XOR parity corresponding to all the remaining pages other than the read fail page in the page group from the nonvolatile memory device 100.

In operation S1117, the recovery circuit 260 may recover the error of the read-failed data by performing an XOR operation on corresponding bits of the data and XOR parity read from the nonvolatile memory device 100 in operation S1115 based on instructions from the processor 220, and store the error-recovered data in a read buffer (not shown) included in at least one of the first buffer memory 230 or the second buffer memory 280.

In operation S1119, the processor 220 may transmit the error-corrected read data stored in a read buffer (not shown) included in the first buffer memory 230 or the second buffer memory 280 in operation S1103 to the host through the host interface 210.

The exemplary method illustrated in FIG. 11 demonstrates the efficacy of embodiments of the disclosed technology in speeding up the read fail recovery process in the presence of program-in-progress pages. In some embodiments, the program-in-progress pages may include pages for which the foggy program operation has been completed, but the fine program operation is still in progress. In other embodiments, the program-in-progress pages may include pages for which a first foggy program operation has been completed, but a second or subsequent foggy program operation is still in progress.

Figure 12:
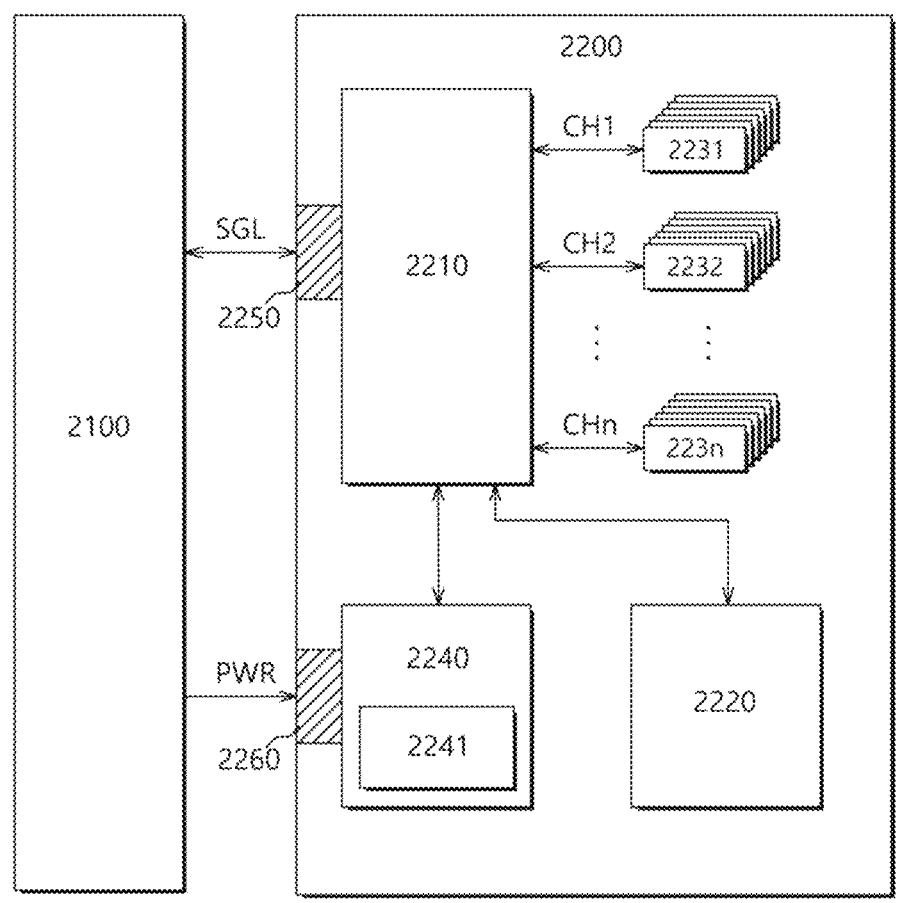
FIG. 12 is a diagram illustrating an example of a data processing system including a solid state drive (SSD), based on an embodiment of the presently disclosed technology.

FIG. 12 is a diagram illustrating an example of a data processing system that includes a solid state drive (SSD), based on an embodiment of the disclosed technology. As shown in FIG. 12, a data processing system 2000 may include a host apparatus 2100 and a SSD 2200.

In some embodiments, the SSD 2200 may include a controller 2210, a buffer memory device 2220, nonvolatile memory devices 2231 to 223n, a power supply 2240, a signal connector 2250, and a power connector 2260.

In an example, the controller 2210 may control an overall operation of the SSD 2220.

In some embodiments, the buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n based on instructions from the controller 2210.

In some embodiments, the nonvolatile memory devices 2231 to 223n may be used as a storage medium of the SSD 2200. The nonvolatile memory devices 2231 to 223n may be coupled to the controller 2210 through a plurality of channels CH1 to CHn. In an example, one or more nonvolatile memory devices may be coupled to one channel. The nonvolatile memory devices coupled to the one channel may be coupled to the same signal bus and the same data bus.

In some embodiments, the power supply 2240 may provide a power PWR input through the power connector 2260 to the inside of the SSD 2200. The power supply 2240 may include an auxiliary power supply 2241, which supplies power to ensure that the SSD 2200 is normally terminated even when a sudden (or abrupt) power-off occurs. In an example, the auxiliary power supply 2241 may include large capacity capacitors capable of charging the power PWR.

In some embodiments, the controller 2210 may exchange a signal SGL with the host apparatus 2100 through the signal connector 2250. The signal SGL may include a command, an address, data, and the like. The signal connector 2250 may be one of various types of connectors, and based on an interfacing method between the host apparatus 2100 and the SSD 2200.

Figure 13:
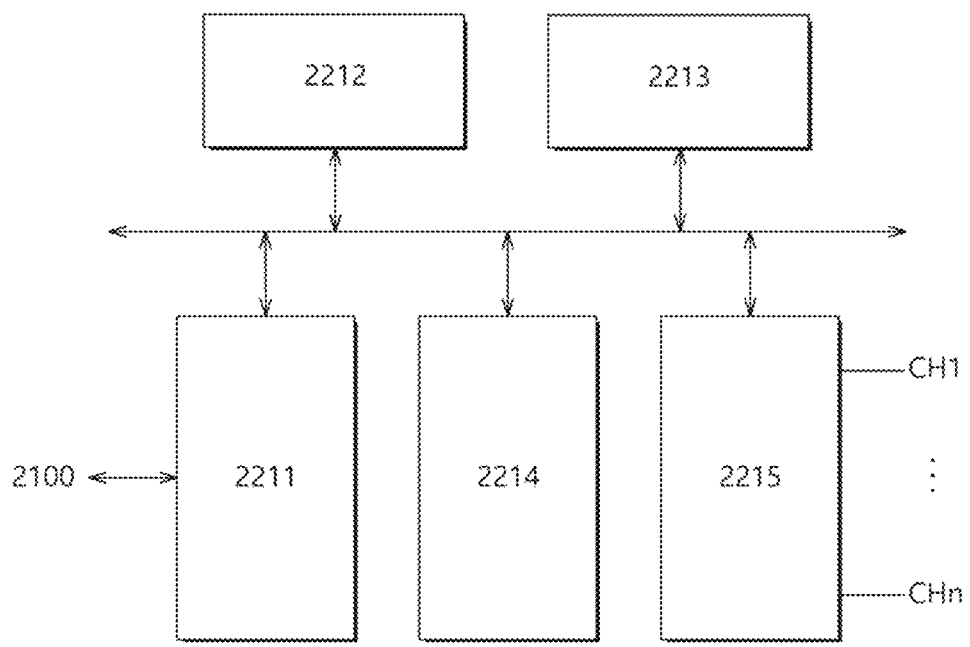
FIG. 13 is a diagram illustrating an example of a controller illustrated in FIG. 12.

FIG. 13 is a diagram illustrating an example of the controller 2210 of FIG. 12. As shown in FIG. 13, the controller 2210 may include a host interface 2211, a controller 2212, a random access memory (RAM) 2213, an error correction code (ECC) component 2214, and a memory interface 2215.

In some embodiments, the host interface 2211 may perform interfacing functions between the host apparatus 2100 and the SSD 2200 according to a protocol of the host apparatus 2100. In an example, the host interface 2211 may communicate with the host apparatus 2100 through any one of a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. In another example, the host interface 2211 may perform a disc emulation function that the host apparatus 2100 recognizes the SSD 2200 as a general-purpose data storage apparatus, for example, a hard disc drive HDD.

In some embodiments, the controller 2212 may analyze and process the signal SGL input from the host apparatus 2100. In an example, the controller 2212 may control operations of internal functional blocks based on firmware and/or software that defines the operation of the SDD 2200. In another example, the RAM 2213 may be operated as a working memory for executing the firmware or software.

In some embodiments, the ECC component 2214 may generate parity data for the data to be transferred to the nonvolatile memory devices 2231 to 223*n*. The generated parity data may be stored in the nonvolatile memory devices 2231 to 223*n* together with the data. In other embodiments, the ECC component 2214 may detect errors for data read from the nonvolatile memory devices 2231 to 223*n* based on the parity data. When detected errors are within a correctable range (e.g., the number of detected errors are fewer than the error-correcting capability of the ECC), the ECC component 2214 may correct the detected errors.

In some embodiments, the memory interface 2215 may provide a control signal such as a command and/or an address to the nonvolatile memory devices 2231 to 223*n* based on instructions from the controller 2212. The memory interface 2215 may exchange data with the nonvolatile memory devices 2231 to 223*n* based on instructions from the controller 2212. For example, the memory interface 2215 may provide data stored in the buffer memory device 2220 to the nonvolatile memory devices 2231 to 223*n* or provide data read from the nonvolatile memory devices 2231 to 223*n* to the buffer memory device 2220.

Figure 14:
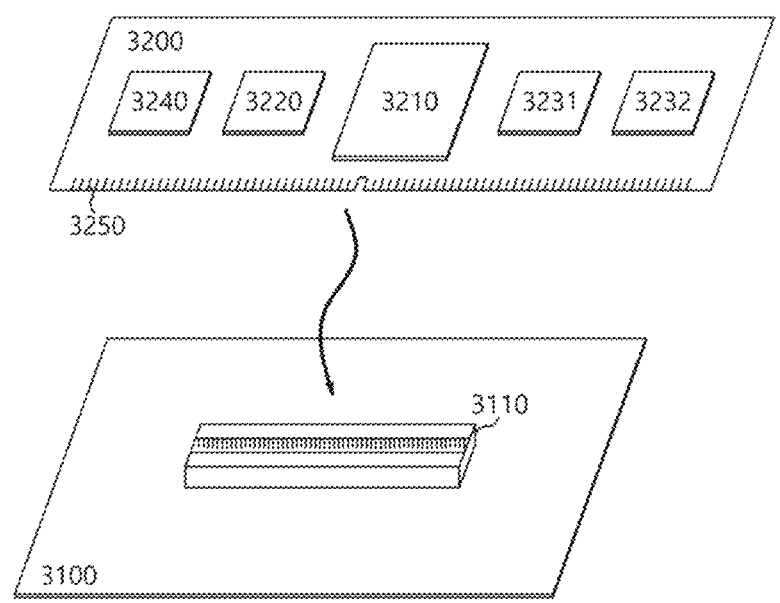
FIG. 14 is a diagram illustrating another example of a data processing system including a data storage apparatus, based on an embodiment of the presently disclosed technology.

FIG. 14 is a diagram illustrating an example of a data processing system including a data storage apparatus, based on an embodiment of the disclosed technology. As shown in FIG. 14, a data processing system 3000 may include a host apparatus 3100 and a data storage apparatus 3200.

In some embodiments, the host apparatus 3100 may be implemented as a board (e.g., a printed circuit board (PCB)). Although not shown in FIG. 14, the host apparatus 3100 may include internal functional blocks configured to perform functions of the host apparatus 3100.

In some embodiments, the host apparatus 3100 may include a connection terminal 3110 such as a socket, a slot, or a connector. The data storage apparatus 3200 may be mounted on the connection terminal 3110.

In some embodiments, the data storage apparatus 3200 may be implemented as a board (e.g., a PCB). In an example, the data storage apparatus 3200 may refer to a memory module or a memory card. In another example, the data storage apparatus 3200 may include a controller 3210, a buffer memory device 3220, nonvolatile memory devices 3231 to 3232, a power management integrated circuit (PMIC) 3240, and a connection terminal 3250.

In some embodiments, the controller 3210 may control an overall operation of the data storage apparatus 3200. For example, the controller 3210 may have the same configuration as the controller 2210 illustrated in FIG. 13.

In some embodiments, the buffer memory device 3220 may temporarily store data to be stored in the nonvolatile memory devices 3231 and 3232. In an example, the buffer memory device 3220 may temporarily store data read from the nonvolatile memory devices 3231 and 3232. In another example, the data temporarily stored in the buffer memory device 3220 may be transmitted to the host apparatus 3100 or the nonvolatile memory devices 3231 and 3232 according to control of the controller 3210.

In some embodiments, the nonvolatile memory devices 3231 and 3232 may be used as a storage medium of the data storage apparatus 3200.

In some embodiments, the PMIC 3240 may provide power through the connection terminal 3250 to the inside of the data storage apparatus 3200. In an example, the PMIC 3240 may manage the power of the data storage apparatus 3200 based on instructions from the controller 3210.

In some embodiments, the connection terminal 3250 may be coupled to the connection terminal 3110 of the host apparatus 3100. A signal such as a command, an address, data and/or power may be transmitted between the host apparatus 3100 and the data storage apparatus 3200 through the connection terminal 3250. The connection terminal 3250 may be configured in various forms according to an interface between the host apparatus 3100 and the data storage apparatus 3200. The connection terminal 3250 may be arranged in any one side of the data storage apparatus 3200.

Figure 15:
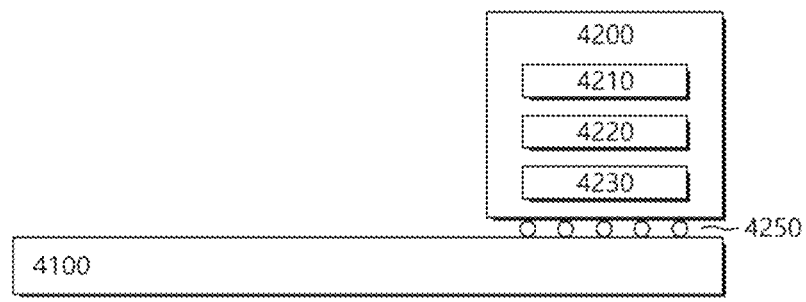
FIG. 15 is a diagram illustrating yet another example of a data processing system including a data storage apparatus, based on an embodiment of the presently disclosed technology.

FIG. 15 is a diagram illustrating an example of a data processing system that includes a data storage apparatus, based on an embodiment of the disclosed technology. As shown in FIG. 15, a data processing system 4000 may include a host apparatus 4100 and a data storage apparatus 4200.

In some embodiments, the host apparatus 4100 may be implemented as a board (e.g., a PCB). Although not shown in FIG. 15, the host apparatus 4100 may include internal functional blocks configured to perform functions of the host apparatus 4100.

In some embodiments, the data storage apparatus 4200 may be implemented in a surface mounting packaging form. In an example, the data storage apparatus 4200 may be mounted on the host apparatus 4100 through a solder ball 4250. In another example, the data storage apparatus 4200 may include a controller 4210, a buffer memory device 4220, and a nonvolatile memory device 4230.

In some embodiments, the controller 4210 may control an overall operation of the data storage apparatus 4200. The controller 4210 may be have the same configuration as the controller 2210 illustrated in FIG. 13.

In some embodiments, the buffer memory device 4220 may temporarily store data to be stored in the nonvolatile memory device 4230. In an example, the buffer memory device 4220 may temporarily store data read from the nonvolatile memory device 4230. In another example, the data temporarily stored in the buffer memory device 4220 may be transmitted to the host apparatus 4100 or the nonvolatile memory device 4230 through control of the controller 4210.

In some embodiments, the nonvolatile memory device 4230 may be used as a storage medium of the data storage apparatus 4200.

Figure 16:
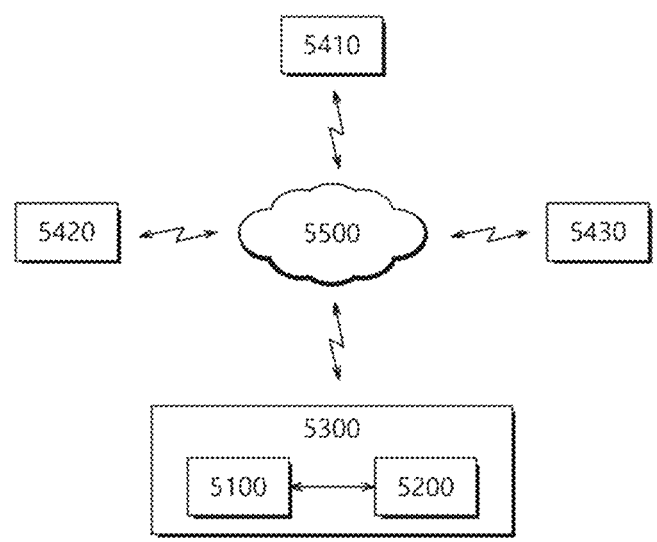
FIG. 16 is a diagram illustrating an example of a network system including a data storage apparatus, based on an embodiment of the presently disclosed technology.

FIG. 16 is a diagram illustrating an example of a network system 5000 that includes a data storage apparatus, based on an embodiment of the disclosed technology. As shown in FIG. 16, the network system 5000 may include a server system 5300 and a plurality of client systems 5410 to 5430 which are coupled through a network 5500.

In some embodiments, the server system 5300 may serve data in response to requests of the plurality of client systems 5410 to 5430. In an example, the server system 5300 may store data provided from the plurality of client systems 5410 to 5430. In another example, the server system 5300 may provide data to the plurality of client systems 5410 to 5430.

In some embodiments, the server system 5300 may include a host apparatus 5100 and a data storage apparatus 5200. The data storage apparatus 5200 may be the data storage device 10 of FIG. 1, the data storage apparatus 2200 of FIG. 12, the data storage apparatus 3200 of FIG. 14, or the data storage apparatus 4200 of FIG. 15.

FIG. 17 is a diagram illustrating an example of a two-stage foggy and fine write operation. As shown in FIG. 17, three intermediate distributions FMA, FMB, and FMC are written (foggy write), and then the intermediate distributions FMA to FMC are used to write the final target threshold voltage distributions A, B, and C (fine write). In this scheme, the verify operations of the intermediate distributions FMA, FMB, and FMC are performed in the above pseudo-negative sense scheme.

The foggy write is a rough write of the upper page data/lower page data. The fine write is an accurate write of the upper page data/lower page data. Specifically, the foggy write operation and the fine write operation are performed as a two-stage write operation.

As shown in FIG. 17, a write operation in a four-level storage scheme including the foggy write operation and the fine write operation will be described. First, starting with the state (1) in which all memory cells are erased, the foggy write operation to a memory cell (2) is performed. Referring to FIG. 17, the foggy write operation is a write operation in which a verify voltage VAV', VBV', or VCV' smaller than the lower limits of the final target threshold voltage distributions E, A, B, and C is used to obtain the intermediate distribution FMA, FMB, or FMC.

The fine write operation to the memory cell (3) is then performed. The fine write operation uses the verify voltage VAV, VBV, or VCV equal to the lower limits of the final target threshold voltage distributions E, A, B, and C to shift the intermediate distribution FMA, FMB, or FMC in the positive direction to obtain the threshold voltage distribution E, A, B, or C. Specifically, the verify voltages VAV', VBV', and VCV' for the foggy write are lower than the respective verify voltages VAV, VBV, and VCV for the fine write. Likewise, the lower limits of the intermediate distributions FMA, FMB, and FMC are smaller than the lower limits of the respective threshold voltage distributions A, B, and C. Note that the upper limits of the intermediate distributions FMA, FMB, and FMC may be higher than the upper limits of the respective threshold voltage distributions A, B, and C.

The intermediate distributions FMA, FMB, and FMC are written before the threshold voltage distributions A, B, and C are written, and are not assigned with the final data. Specifically, the memory cell reading is set to read voltages RA, RB, and RC that fall between the upper and lower limits of two of the threshold voltage distributions E and A to C.

Embodiments of the disclosed technology provide methods, systems and devices for improving an efficiency of a read fail recovery operation. An exemplary data storage device includes a nonvolatile memory device including a plurality of page groups; a data buffer configured to store data to be stored in data pages of each of the plurality of page groups; an exclusive OR (XOR) parity buffer configured to store an XOR parity to be stored in an XOR parity page of each of the plurality of page groups; and a processor configured to, when program-in-progress pages are present in a page group including a read fail page in which read-failed data is stored in read fail occurrence during performing of a read operation according to a read request from a host, control data and an XOR parity corresponding to the program-in-progress pages to be read from the data buffer and the XOR parity buffer and control an error of the read-failed data to be recovered using data corresponding to program-completed pages other than the read fail page, and the data and the XOR parity read from the data buffer and the XOR parity buffer.

In some embodiments, the data storage device further includes an XOR operation circuit configured to generate the XOR parity by performing an XOR operation on the data to be stored in the data pages of each of the plurality of page groups; and a recovery circuit configured to recover the error of the read-failed data by performing an XOR operation on corresponding bits of data corresponding to the program-completed pages, and the data and the XOR parity read from the data buffer and the XOR parity buffer. In other embodiments, the processor controls the recovery circuit to read the data corresponding to the program-completed pages other than the read fail page from the nonvolatile memory device. In yet other embodiments, the processor controls the recovery circuit to read the data corresponding to the program-completed pages other than the read fail page from the data buffer. In these embodiments, when the program-in-progress pages are not present in the page group including the read fail page, the processor controls the recovery circuit to recover the error of the read-failed data by reading data and an XOR parity corresponding to remaining pages other than the read fail page in the page group from the nonvolatile memory device.

In some embodiments, each of the plurality of page groups includes a plurality of dies, and the pages included in each page group include one page coupled to the same word line in each of the dies. In other embodiments, each of the plurality of page groups includes a plurality of dies, and the pages included in each page group include a plurality of pages coupled to the same word line in each of the dies.

Another exemplary data storage device includes a nonvolatile memory device including a page group in which program-completed pages and program-in-progress pages are mixed; a buffer memory configured to buffer data and an exclusive OR (XOR) parity to be stored in pages of the page group; a recovery circuit configured to recover an error of read-failed data; and a processor configured to control the recovery circuit to read data and an XOR parity corresponding to the program-in-progress pages from the buffer memory and to recover the error of the read-failed data using data corresponding to remaining program-completed pages other than a page in which the read-failed data is stored among the program-completed pages, and the data and the XOR parity read from the buffer memory.

In some embodiments, the buffer memory includes a data buffer configured to buffer the data to be stored in the pages of the page group; and an XOR parity buffer configured to buffer the XOR parity. In some embodiments, the data storage device further includes an XOR operation circuit configured to generate the XOR parity by performing an XOR operation on the data buffered in the data buffer In some embodiments, the recovery circuit recovers the error of the read-failed data by performing an XOR operation on corresponding bits of the data corresponding to the remaining program-completed pages, and the data and the XOR parity read from the buffer memory. In other embodiments, the processor controls the recovery circuit to read the data corresponding to the remaining program-completed pages from the nonvolatile memory device. In yet other embodiments, the processor controls the recovery circuit to read the data corresponding to the remaining program-completed pages from the buffer memory.

A method for operating a data storage device, the method includes performing a read operation on a nonvolatile memory device in response to a read request from a host; confirming whether or not one or more program-in-progress pages are present in a page group including a page in which read-failed data is stored in read fail occurrence; reading, when the program-in-progress pages are present in the page group, data and an exclusive OR (XOR) parity corresponding to the program-in-progress pages from a buffer memory; and recovering an error of the read-failed data using data corresponding to program-completed pages other than the page in which the read-failed data is stored, and the data and the XOR parity read from the buffer memory.

In some embodiments, the method further includes before the recovering of the error of the read-failed data, reading the data corresponding to the program-completed pages from the nonvolatile memory device. In other embodiments, the method further includes before the recovering of the error of the read-failed data, reading the data corresponding to the program-completed pages from the buffer memory.

In some embodiments, the confirming of whether or not the one or more program-in-progress pages are present includes reading data and an XOR parity corresponding to remaining pages other than the page in which the read-failed data is stored among pages of the page group when the program-in-progress pages are not present in the page group.

In some embodiments, the recovering of the error of the read-failed data includes performing an XOR operation on corresponding bits of data corresponding to the program-completed pages, and the data and the XOR parity read from the buffer memory.

In some embodiments, the program-completed pages are pages on which both a first program operation and a second program operation are performed; and the program-in-progress pages are pages on which the first program operation is performed and the second program operation is not performed.

While the disclosed technology has been shown and described with reference to certain exemplary embodiments thereof, it will be understood by those skilled in the art that various changes in form and details may be made therein without departing from the spirit and scope of the disclosed technology as defined by the appended claims and their equivalents. Therefore, the scope of the disclosed technology should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto. That is, it should be apparent to those skilled in the art that various modifications can be made on the basis of the technological scope of the disclosed technology.

Meanwhile, the exemplary embodiments of the disclosed technology have been described in the drawings and specification. Although specific terminologies are used here, those are only to explain the embodiments of the disclosed technology. Therefore, the disclosed technology is not restricted to the above-described embodiments and many variations are possible within the spirit and scope of the disclosed technology. It should be apparent to those skilled in the art that various modifications can be made on the basis of the technological scope of the disclosed technology in addition to the embodiments disclosed herein.

What is claimed is:

1. A data storage device comprising:
a nonvolatile memory device including a plurality of page groups;
a data buffer configured to store data to be stored in data pages of each of the plurality of page groups;
an exclusive OR (XOR) parity buffer configured to store an XOR parity to be stored in an XOR parity page of each of the plurality of page groups; and
a processor configured to, when program-in-progress pages are present in a page group including a read fail page in which read-failed data is stored in read fail occurrence during performing of a read operation according to a read request from a host, control data and an XOR parity corresponding to the program-in-progress pages to be read from the data buffer and the XOR parity buffer and control an error of the read-failed data to be recovered using data corresponding to program-completed pages other than the read fail page, and the data and the XOR parity read from the data buffer and the XOR parity buffer,
wherein the program-completed pages are pages on which both a first program operation and a second program operation are performed,
wherein the program-in-progress pages are pages on which the first program operation is performed and the second program operation is not performed,
wherein a threshold voltage distribution of the program-in-progress pages does not reach a final target threshold voltage distribution, and
wherein a threshold voltage distribution of the program-completed pages has the final target threshold voltage distribution.

2. The data storage device of claim 1, further comprising an XOR operation circuit configured to generate the XOR parity by performing an XOR operation on the data to be stored in the data pages of each of the plurality of page groups.

3. The data storage device of claim 1, further comprising a recovery circuit configured to recover the error of the read-failed data by performing an XOR operation on corresponding bits of data corresponding to the program-completed pages, and the data and the XOR parity read from the data buffer and the XOR parity buffer.

4. The data storage device of claim 3, wherein the processor controls the recovery circuit to read the data corresponding to the program-completed pages other than the read fail page from the nonvolatile memory device.

5. The data storage device of claim 3, wherein the processor controls the recovery circuit to read the data corresponding to the program-completed pages other than the read fail page from the data buffer.

6. The data storage device of claim 3, wherein when the program-in-progress pages are not present in the page group including the read fail page, the processor controls the recovery circuit to recover the error of the read-failed data by reading data and an XOR parity corresponding to remaining pages other than the read fail page in the page group from the nonvolatile memory device.

7. The data storage device of claim 1, wherein each of the plurality of page groups includes a plurality of dies, and the pages included in each page group include one page coupled to the same word line in each of the dies.

8. The data storage device of claim 1, wherein each of the plurality of page groups includes a plurality of dies, and the pages included in each page group include a plurality of pages coupled to the same word line in each of the dies.

9. A data storage device comprising:
a nonvolatile memory device including a page group in which program-completed pages and program-in-progress pages are mixed;
a buffer memory configured to buffer data and an exclusive OR (XOR) parity to be stored in pages of the page group;
a recovery circuit configured to recover an error of read-failed data; and
a processor configured to control the recovery circuit to read data and an XOR parity corresponding to the program-in-progress pages from the buffer memory and to recover the error of the read-failed data using data corresponding to remaining program-completed pages other than a page in which the read-failed data is stored among the program-completed pages, and the data and the XOR parity read from the buffer memory,
wherein the program-completed pages are pages on which both a first program operation and a second program operation are performed,
wherein the program-in-progress pages are pages on which the first program operation is performed and the second program operation is not performed,
wherein a threshold voltage distribution of the program-in-progress pages does not reach a final target threshold voltage distribution, and
wherein a threshold voltage distribution of the program-completed pages has the final target threshold voltage distribution.

10. The data storage device of claim 9, wherein the buffer memory includes;
a data buffer configured to buffer the data to be stored in the pages of the page group; and an XOR parity buffer configured to buffer the XOR parity.

11. The data storage device of claim 10, further comprising an XOR operation circuit configured to generate the XOR parity by performing an XOR operation on the data buffered in the data buffer.

12. The data storage device of claim 9, wherein the recovery circuit recovers the error of the read-failed data by performing an XOR operation on corresponding bits of the data corresponding to the remaining program-completed pages, and the data and the XOR parity read from the buffer memory.

13. The data storage device of claim 9, wherein the processor controls the recovery circuit to read the data corresponding to the remaining program-completed pages from the nonvolatile memory device.

14. The data storage device of claim 9, wherein the processor controls the recovery circuit to read the data corresponding to the remaining program-completed pages from the buffer memory.

15. An operating method of a data storage device comprising:
performing a read operation on a nonvolatile memory device in response to a read request from a host;
confirming whether or not one or more program-in-progress pages are present in a page group including a page in which read-failed data is stored in read fail occurrence;
reading, when the program-in-progress pages are present in the page group, data and an exclusive OR (XOR) parity corresponding to the program-in-progress pages from a buffer memory; and
recovering an error of the read-failed data using data corresponding to program-completed pages other than the page in which the read-failed data is stored, and the data and the XOR parity read from the buffer memory,
wherein the program-completed pages are pages on which both a first program operation and a second program operation are performed,
wherein the program-in-progress pages are pages on which the first program operation is performed and the second program operation is not performed,
wherein a threshold voltage distribution of the program-in-progress pages does not reach a final target threshold voltage distribution, and
wherein a threshold voltage distribution of the program-completed pages has the final target threshold voltage distribution.

16. The method of claim 15, further comprising:
before the recovering of the error of the read-failed data, reading the data corresponding to the program-completed pages from the nonvolatile memory device.

17. The method of claim 15, further comprising:
before the recovering of the error of the read-failed data, reading the data corresponding to the program-completed pages from the buffer memory.

18. The method of claim 15, wherein the confirming of whether or not the one or more program-in-progress pages are present includes reading data and an XOR parity corresponding to remaining pages other than the page in which the read-failed data is stored among pages of the page group when the program-in-progress pages are not present in the page group.

19. The method of claim 15, wherein the recovering of the error of the read-failed data includes performing an XOR operation on corresponding bits of data corresponding to the program-completed pages, and the data and the XOR parity read from the buffer memory.

* * * * *